United States Patent
Zhang et al.

(10) Patent No.: US 12,015,392 B2
(45) Date of Patent: Jun. 18, 2024

(54) SURFACE ACOUSTIC WAVE DEVICES USING PIEZOELECTRIC FILM ON SILICON CARBIDE

(71) Applicant: Board of Trustees of the University of Illinois, Urbana, IL (US)

(72) Inventors: Shibin Zhang, Shanghai (CN);
Ruochen Lu, Chanpaign, IL (US);
Steffen Link, Urbana, IL (US);
Yansong Yang, Urbana, IL (US);
Songbin Gong, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 694 days.

(21) Appl. No.: 17/211,094

(22) Filed: Mar. 24, 2021

(65) Prior Publication Data
US 2021/0305965 A1   Sep. 30, 2021

Related U.S. Application Data

(60) Provisional application No. 62/994,967, filed on Mar. 26, 2020.

(51) Int. Cl.
*H03H 9/02* (2006.01)
*H03H 9/145* (2006.01)
(Continued)

(52) U.S. Cl.
CPC .... *H03H 9/02574* (2013.01); *H03H 9/02559* (2013.01); *H03H 9/02637* (2013.01);
(Continued)

(58) Field of Classification Search
CPC .......... H03H 9/02574; H03H 9/02559; H03H 9/02637; H03H 9/02992; H03H 9/145;
(Continued)

(56) References Cited

U.S. PATENT DOCUMENTS

2021/0234528 A1\*  7/2021  Yang ................. H03H 9/568
2021/0305965 A1\*  9/2021  Zhang ................ H03H 9/145

OTHER PUBLICATIONS

Gong et al., "Design and analysis of lithium—niobate-based high electromechanical coupling RF-MEMS resonators for wideband filtering", Microwave Theory and Techniques, IEEE Transactions on, vol. 61, No. 1, pp. 403-414, 2013.
(Continued)

*Primary Examiner* — Daniel Pihulic
(74) *Attorney, Agent, or Firm* — Lowenstein Sandler LLP

(57) ABSTRACT

An acoustic resonator includes a piezoelectric thin film (PTF) disposed on a carrier substrate. The PTF confines a fundamental shear-horizontal (SH0) surface-acoustic wave (SAW) within the PTF. The acoustic resonator includes an input bus line coupled to an input source and a ground bus line coupled to a ground potential. The acoustic resonator includes a first grating reflector disposed at a first end of the PTF and coupled between the input bus line and the ground bus line. The acoustic resonator includes a second grating reflector disposed at a second end of the PTF and coupled between the input bus line and the ground bus line. The acoustic resonator includes interdigital transducers (IDTs) disposed between the first grating reflector and the second grating reflector. Each IDT includes an input electrode coupled to the input bus line, and a ground electrode coupled to the ground bus line.

24 Claims, 24 Drawing Sheets

(51) Int. Cl.
  *H03H 9/25* (2006.01)
  *H03H 9/64* (2006.01)
(52) U.S. Cl.
  CPC ........ *H03H 9/02992* (2013.01); *H03H 9/145* (2013.01); *H03H 9/25* (2013.01); *H03H 9/6483* (2013.01)
(58) Field of Classification Search
  CPC .... H03H 9/25; H03H 9/6483; H03H 9/02834; H03H 9/02921; H03H 9/02929
  See application file for complete search history.

(56) References Cited

OTHER PUBLICATIONS

Kimura et al., "Comparative Study of Acoustic Wave Devices Using Thin Piezoelectric Plates in the 3-5-GHz Range", IEEE Transactions on Microwave Theory and Techniques, vol. 67, No. 3, pp. 915-921, 2019.
Pastureaud et al., "High-frequency surface acoustic waves excited on thin-oriented LiNbO3 single-crystal layers transferred onto silicon", IEEE transactions on ultrasonics, ferroelectrics, and frequency control, vol. 54, No. 4, pp. 870-876, 2007.
Song et al., "Elimination of Spurious Modes in SH0 Lithium Niobate Laterally Vibrating Resonators", IEEE Electron Device Letters, vol. 36, No. 11, pp. 1198-1201, 2015.
Kimura et al., "3.5 GHz longitudinal leaky surface acoustic wave resonator using a multilayered waveguide structure for high acoustic energy confinement", Japanese Journal of Applied Physics, vol. 57, No. 7S1, p. 07LD15, 2018.
Yang et al., "A 1.65 GHz lithium Niobate A1 resonator with electromechanical coupling of 14% and Q of 3112", in 2019 IEEE 32nd International Conference on Micro Electro Mechanical Systems (MEMS), pp. 875-878, 2019.
Takai et al., "High-performance SAW resonator on new multilayered substrate using LiTaO3 crystal", IEEE transactions on ultrasonics, ferroelectrics, and frequency control, vol. 64, No. 9, pp. 1382-1389, 2017.
Kadota et al., "Wideband acoustic wave resonators composed of hetero acoustic layer structure", Japanese Journal of Applied Physics, vol. 57, No. 7S1, p. 07LD12, 2018.
McSkimin et al., "Elastic moduli of diamond as a function of pressure and temperature", Journal of Applied Physics, vol. 43, No. 7, pp. 2944-2948, 1972.
Burgemeister, E., "Thermal conductivity of natural diamond between 320 and 450 K", Physica B+ C, vol. 93, No. 2, pp. 165-179, 1978.
Kamitani et al., "The elastic constants of silicon carbide: A Brillouin-scattering study of 4H and 6H SiC single crystals", Journal of applied physics, vol. 82, No. 6, pp. 3152-3154, 1997.
Levy et al., "Fabrication of single-crystal lithium niobate films by crystal ion slicing", Applied Physics Letters, vol. 73, No. 16, pp. 2293-2295, 1998.
Lu et al., "Accurate Extraction of Large Electromechanical Coupling in Piezoelectric MEMS Resonators", Journal of Microelectromechanical Systems, vol. 28, No. 2, pp. 209-218, 2019.
Iwamoto et al., "Transverse modes in IHP SAW resonator and their suppression method", in 2018 IEEE International Ultrasonics Symposium (IUS), pp. 1-4, 2018.
Zhang et al., "Transverse mode spurious resonance suppression in Lamb wave MEMS resonators: theory, modeling, and experiment", IEEE Transactions on electron devices, vol. 62, No. 9, pp. 3034-3041, 2015.
Kuznetsova et al., "Investigation of acoustic waves in thin plates of lithium niobate and lithium tantalate", IEEE transactions on ultrasonics, ferroelectrics, and frequency control, vol. 48, No. 1, pp. 322-328, 2001.
Nakao et al., "Smaller surface acoustic wave duplexer for US personal communication service having good temperature characteristics", Japanese Journal of Applied Physics, vol. 46, No. 7S, p. 4760, 2007.
Kimura et al., "A High Velocity and Wideband SAW on a Thin LiNbO3 Plate Bonded on a Si Substrate in the SHF Range", in 2019 IEEE International Ultrasonics Symposium (IUS), pp. 1239-1248, 2019.
Bell et al., "Surface-acoustic-wave resonators", Proceedings of the IEEE, vol. 64, No. 5, pp. 711-721, 1976.
Kovacs et al., "Improved material constants for LiNbO3 and LiTaO3", in Ultrasonics Symposium, 1990. Proceedings., IEEE, vol. 1, pp. 435-438, 1990.
Kim et al., "Thermal Expansion of Lithium Tantalate and Lithium Niobate Single Crystals", Journal of Applied Physics, vol. 40, No. 11, pp. 4637-4641, 1969.
Glassbrenner et al., "Thermal conductivity of silicon and germanium from 3 K to the melting point", Physical Review, vol. 134, No. 4A, p. A1058, 1964.
Okada et al., "Precise determination of lattice parameter and thermal expansion coefficient of silicon between 300 and 1500 K", Journal of applied physics, vol. 56, No. 2, pp. 314-320, 1984.
Pestka et al., "Measurement of the elastic constants of a columnar SiC thin film", Physical review letters, vol. 100, No. 5, p. 055503, 2008.
Petousis et al., "High-throughput screening of inorganic compounds for the discovery of novel dielectric and optical materials", Scientific data, vol. 4, p. 160134, 2017.
Lei et al., "Characterization of thermoelectric properties of heavily doped n-type polycrystalline silicon carbide thin films", IEEE Transactions on Electron Devices, vol. 60, No. 1, pp. 513-517, 2012.
Roy et al., "Fabrication and characterization of polycrystalline SiC resonators", IEEE Transactions on electron devices, vol. 49, No. 12, pp. 2323-2332, 2002.
Li et al., "Thermal expansion and thermal expansion anisotropy of SiC polytypes", Journal of the American Ceramic Society, vol. 70, No. 7, pp. 445-448, 1987.
Gibbs et al., "The variation of the dielectric constant of diamond with pressure", Philosophical Magazine, vol. 9, No. 99, pp. 367-375, 1964.
Slack et al., "Thermal expansion of some diamondlike crystals", Journal of Applied Physics, vol. 46, No. 1, pp. 89-98, 1975.
Bernstein, B., "Elastic constants of synthetic sapphire at 27 C", Journal of Applied Physics, vol. 34, No. 1, pp. 169-172, 1963.
Dobrovinskaya et al., "Properties of sapphire", in Sapphire: Springer, pp. 55-176, 2009.
Bechmann, R., "Elastic and piezoelectric constants of alpha-quartz", Physical review, vol. 110, No. 5, p. 1060, 1958.
Horai et al., "Thermal conductivity of rock-forming minerals", Earth and Planetary Science Letters, vol. 6, No. 5, pp. 359-368, 1969.
Kosinski et al., "Thermal expansion of alpha quartz", in Proceedings of the 45th Annual Symposium on Frequency Control 1991, pp. 22-28, 1991.
Tomar et al., "Temperature coefficient of elastic constants of SiO2 over-layer on LiNbO3 for a temperature stable SAW device", Journal of Physics D: Applied Physics, vol. 36, No. 15, p. 1773, 2003.
Ting, T., "Longitudinal and transverse waves in anisotropic elastic materials", Acta Mechanica, vol. 185, No. 3-4, pp. 147-164, 2006.
Ting, T., "Transverse waves in anisotropic elastic materials", Wave Motion, vol. 44, No. 2, pp. 107-119, 2006.
Hashimoto et al., "Wavenumber domain analysis of two-dimensional SAW images captured by phase-sensitive laser probe system", IEEE Transactions on Ultrasonics, Ferroelectrics, and Frequency Control, vol. 54, No. 5, pp. 1072-1075, 2007.
Yao et al., "Fabrication of Y128- and Y36-cut lithium niobate single-crystalline thin films by crystal-ion-slicing technique", Japanese Journal of Applied Physics, vol. 57, No. 4S, p. 04FK05, 2018.

(56) References Cited

OTHER PUBLICATIONS

Carbonero et al., "Comparison between beryllium-copper and tungsten high frequency air coplanar probes", IEEE Transactions on Microwave Theory and Techniques, vol. 43, No. 12, pp. 2786-2793, 1995.
Smith et al., "Temperature dependence of the elastic, piezoelectric, and dielectric constants of lithium tantalate and lithium niobate", Journal of applied physics, vol. 42, No. 6, pp. 2219-2230, 1971.
Li et al., "The single crystal elastic constants of hexagonal SiC to 1000 C", International journal of high technology ceramics, vol. 4, No. 1, pp. 1-10, 1988.
Makkonen et al., "Surface-acoustic-wave devices for the 2.5-5 GHz frequency range based on longitudinal leaky waves", Applied physics letters, vol. 82, No. 19, pp. 3351-3353, 2003.
Dogheche et al., "High-frequency surface acoustic wave devices based on LiNbO3-diamond multilayered structure", Applied physics letters, vol. 87, No. 21, p. 213503, 2005.
Takai et al., "High-Performance SAW Resonator With Simplified LiTaO3/SiO2 Double Layer Structure on Si Substrate", IEEE transactions on ultrasonics, ferroelectrics, and frequency control, vol. 66, No. 5, pp. 1006-1013, 2019.
Hickernell, F., "DC voltage effects on SAW device interdigital electrodes", in 15th International Reliability Physics Symposium, pp. 144-148, 1977.
Hickernell et al., "Pulsed DC voltage breakdown between interdigital electrodes", in 1972 Ultrasonics Symposium, pp. 388-391, 1972.
Hesjedal et al., "A microscopic view on acoustomigration", IEEE transactions on ultrasonics, ferroelectrics, and frequency control, vol. 52, No. 9, pp. 1584-1593, 2005.
Bordui et al., "Chemically reduced lithium niobate single crystals: Processing, properties and improved surface acoustic wave device fabrication and performance", Journal of applied physics, vol. 85, No. 7, pp. 3766-3769, 1999.
Rosenblum et al., "Thermally stimulated field emission from pyroelectric LiNbO3", Applied physics letters, vol. 25, No. 1, pp. 17-19, 1974.
Hickernell et al., "Voltage breakdown characteristics of close spaced aluminum arc gap structures on oxidized silicon", in 15th International Reliability Physics Symposium, pp. 128-131, 1977.
Takayama et al., "Impact of composition and structure of al alloy electrodes to power durability of SAW devices", in 2014 IEEE International Ultrasonics Symposium, pp. 886-892, 2014.
Nussl et al., "Enhanced stress durability of nano resonators with scandium doped electrodes", Materials characterization, vol. 61, No. 11, pp. 1054-1060, 2010.
Nishihara et al., "Improvement in power durability of SAW filters", in 1995 IEEE Ultrasonics Symposium. Proceedings. An International Symposium, vol. 1, pp. 383-388, 1995.
Nussl et al., "Correlation between texture and mechanical stress durability of thin aluminum films", Thin solid films, vol. 556, pp. 376-380, 2014.
Kamijo et al., "High resistance to stress-migration of [111] textured Al electrodes for surface acoustic wave devices", in AIP Conference Proceedings, American Institute of Physics, vol. 418, No. 1, pp. 239-249, 1998.
Fu et al., "Texture-enhanced Al—Cu electrodes on ultrathin Ti buffer layers for high-power durable 2.6 GHz Saw filters", AIP Advances, vol. 8, No. 4, p. 045212, 2018.
Marks et al., "Impact of SAW device passivation on RF performance", IEEE transactions on ultrasonics, ferroelectrics, and frequency control, vol. 48, No. 5, pp. 1362-1366, 2001.
Kim et al., "Passivation layer effects on power durability of SAW duplexer", in 1999 IEEE Ultrasonics Symposium Proceedings, International Symposium (Cat. No. 99CH37027), vol. 1, pp. 39-42, 1999.
Li et al., "Low phase noise RF oscillators based on thin-film lithium niobate acoustic delay lines", J. Microelectromech. Syst., vol. 29, No. 2, pp. 129-131, Apr. 2020.
Lu et al., "GHz low-loss acoustic RF couplers in lithium Niobate thin film", IEEE Trans. Ultrason., Ferroelectr., Freq. Control, early access, doi: 10.1109/TUFFC.2020.2971196, pp. 1448-1461, Feb. 3, 2020.
Yang et al., "High Q antisymmetric mode lithium Niobate MEMS resonators with spurious mitigation", J. Microelectromech. Syst., vol. 29, No. 2, pp. 135-143, Apr. 2020.
Naumenko, N., "LiNbO3 plate bonded to quartz as a substrate for high frequency wideband SAW devices", in Proc. IEEE Int. Ultrason. Symp. (IUS), pp. 1227-1230, Oct. 2019.
Kimura et al., "S0Mode Lamb wave resonators using LiNbO3 thin plate on acoustic multilayer reflector", Jpn. J. Appl. Phys., vol. 52, No. 7S, Jul. 2013, 5 pages.
Tsutsumi et al., "A design technique to enhance isolation of duplexer in single-ended and differential modes", in Proc. IEEE Int. Ultrason. Symp., doi: 10.1109/ULTSYM.2011.0458, pp. 1833-1836, Oct. 2011.
Gimenez et al., "Involving source-load leakage effects to improve isolation in ladder acoustic wave filters", in IEEE MTT-S Int. Microw. Symp. Dig., doi: 10.1109/MWSYM.2016.7540149, pp. 1-4, May 2016.
Triano et al., "Relation between electromagnetic coupling effects and network synthesis for AW ladder type filters", in Proc. IEEE Int. Ultrason. Symp. (IUS), doi: 10.1109/ULTSYM.2017.8091644, pp. 1-4, Sep. 2017.

* cited by examiner

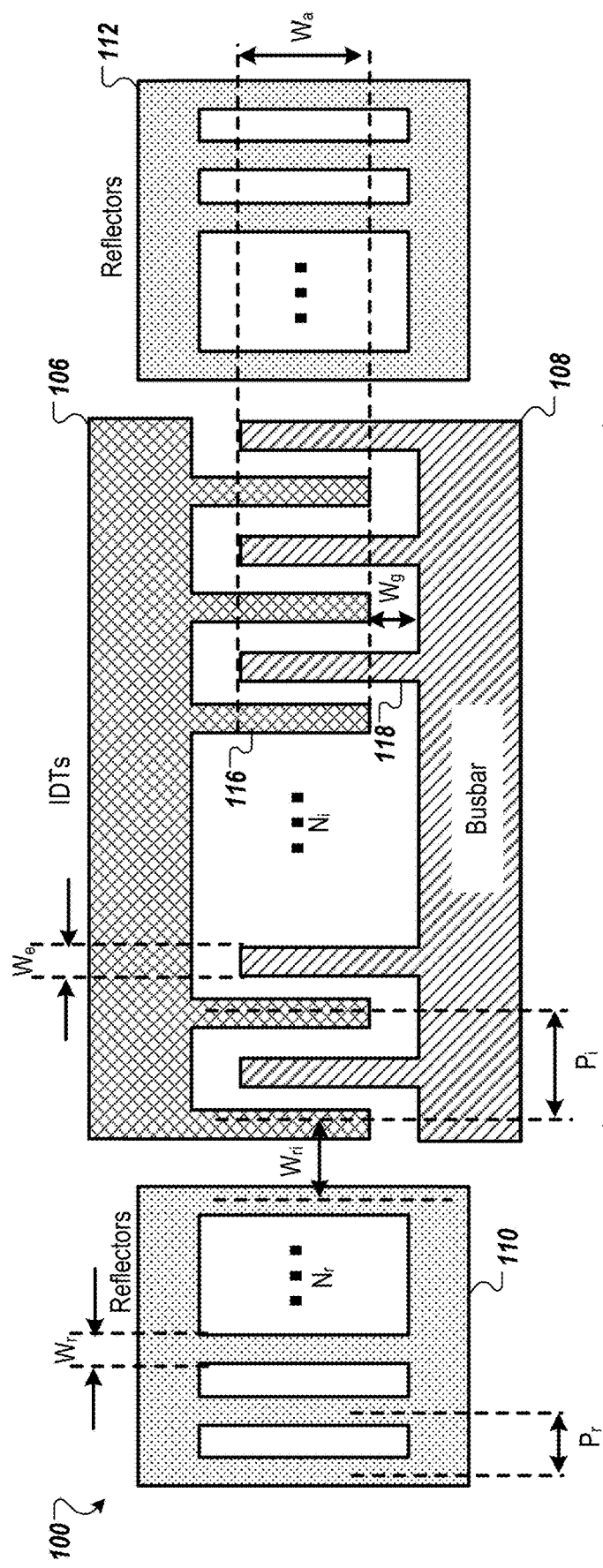
FIG. 1A
FIG. 1B

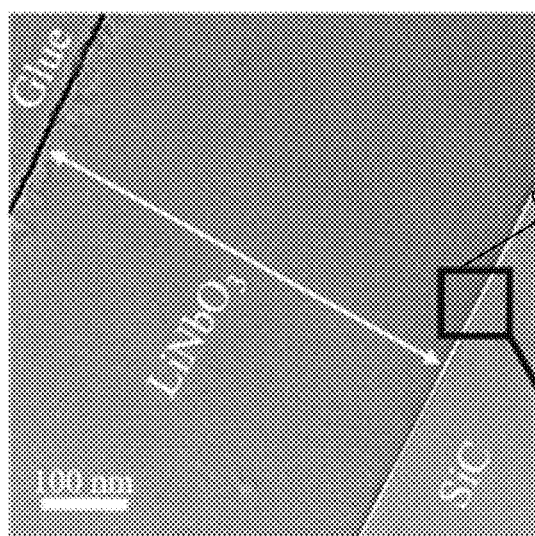
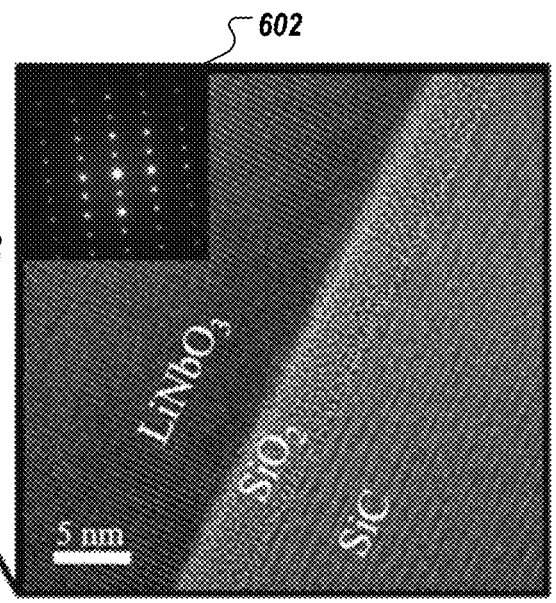
FIG. 6A                FIG. 6B
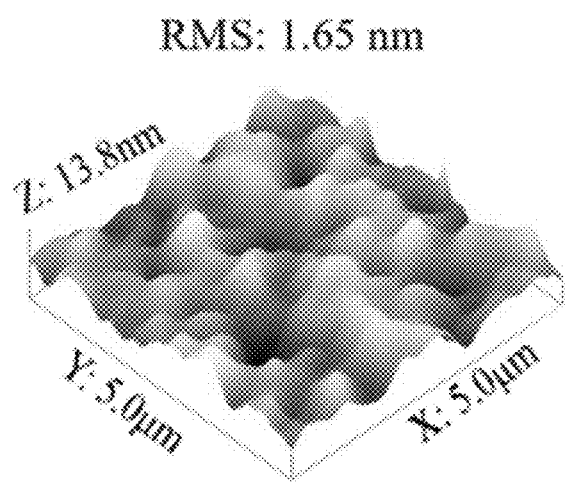
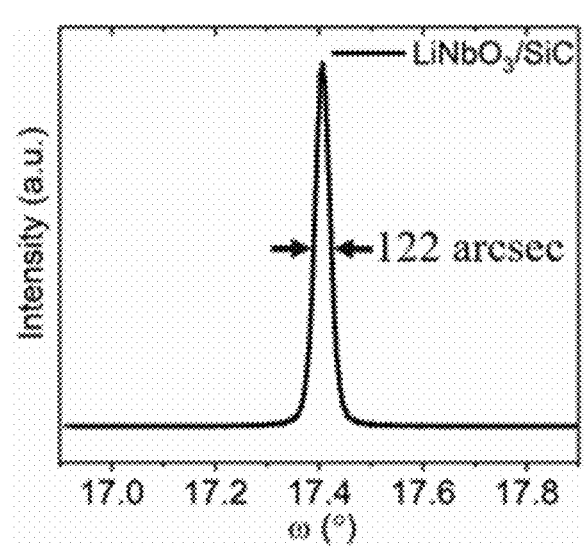
FIG. 6C                FIG. 6D

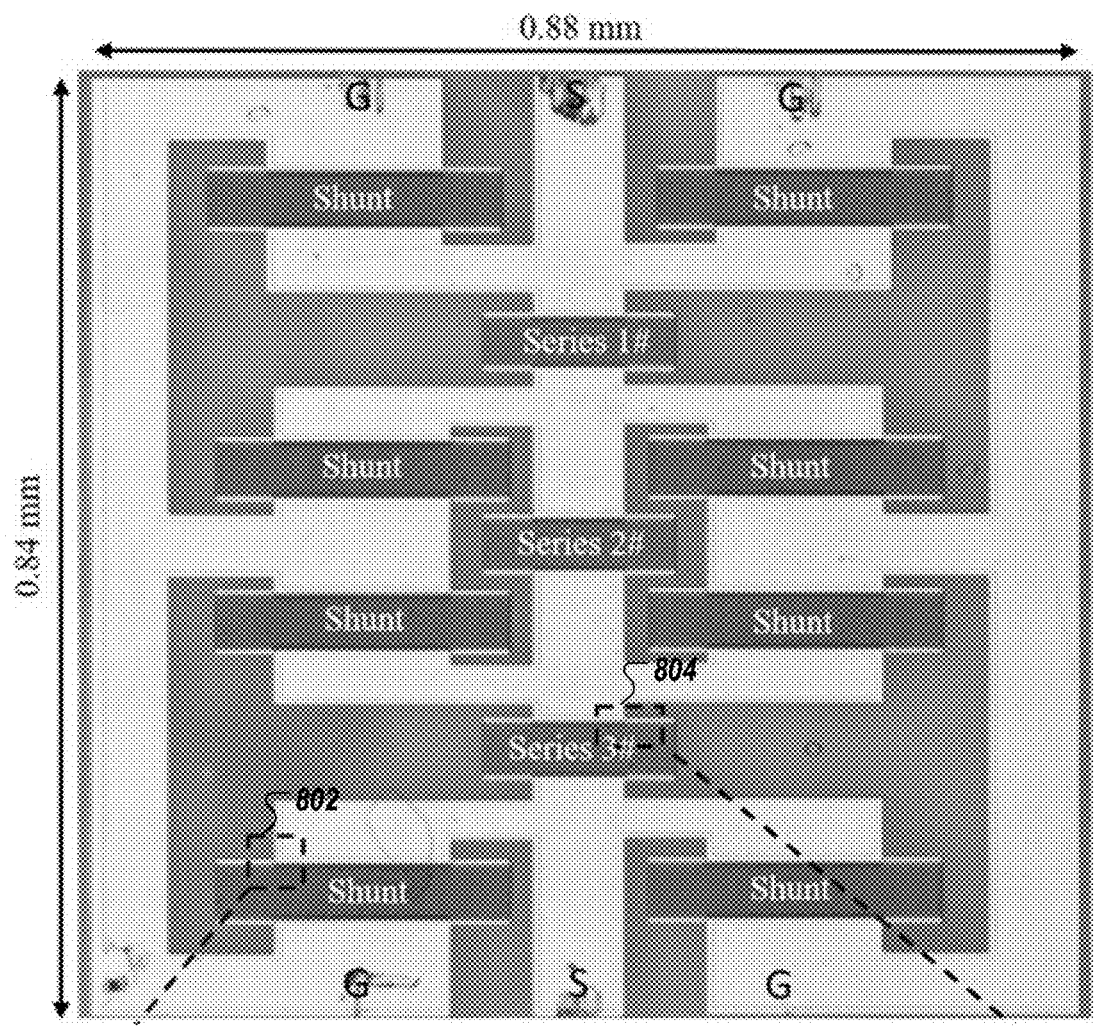
FIG. 8A
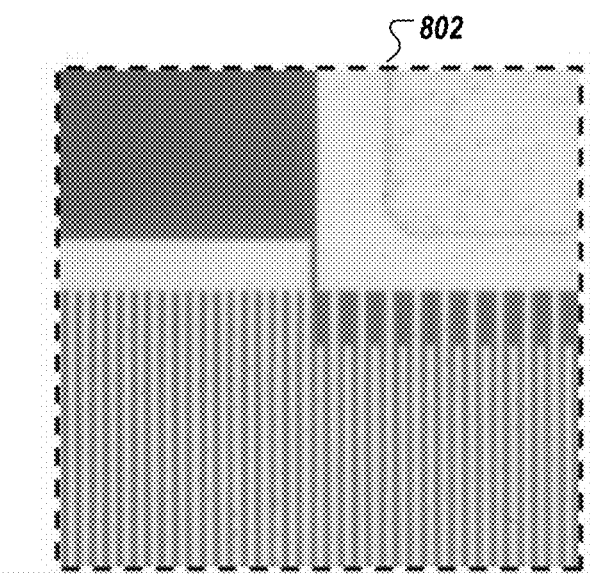 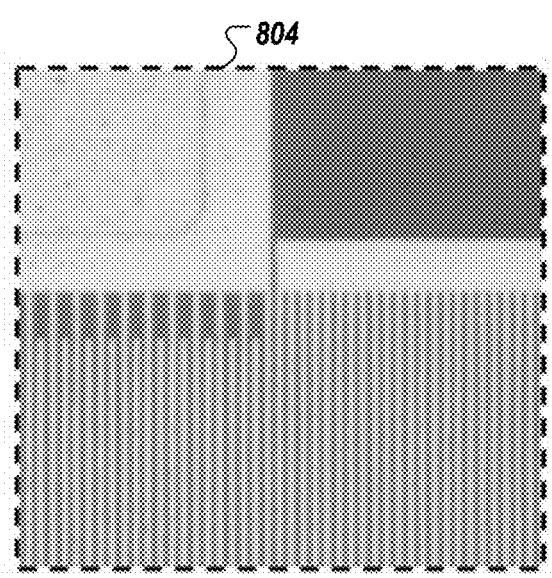
FIG. 8B  FIG. 8C

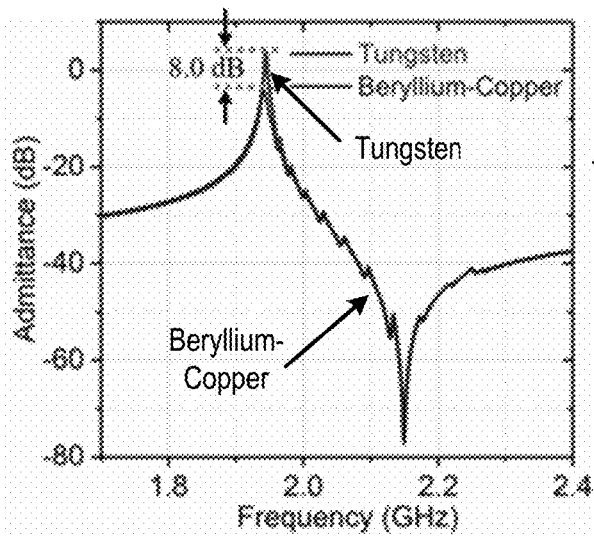
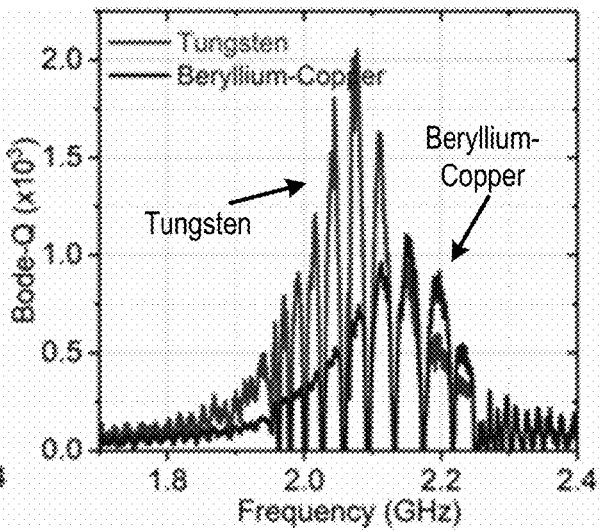
FIG. 11A
FIG. 11B
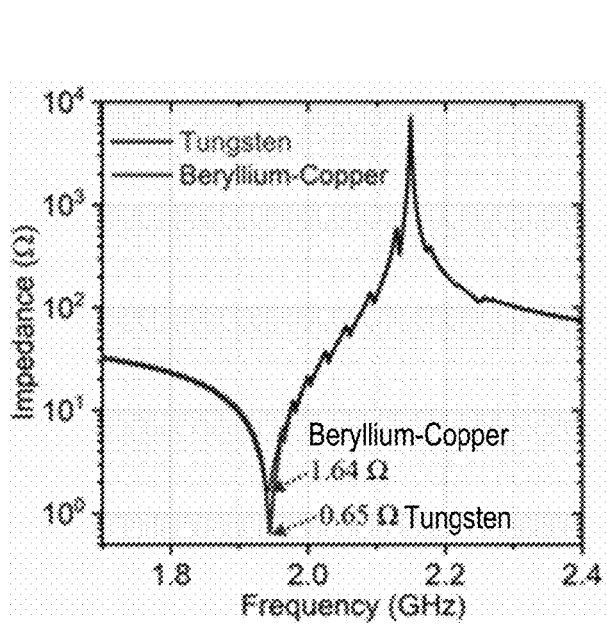
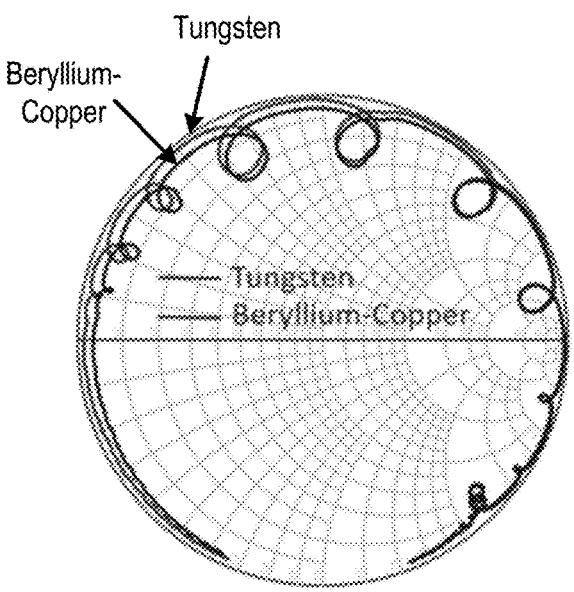
FIG. 11C
FIG. 11D

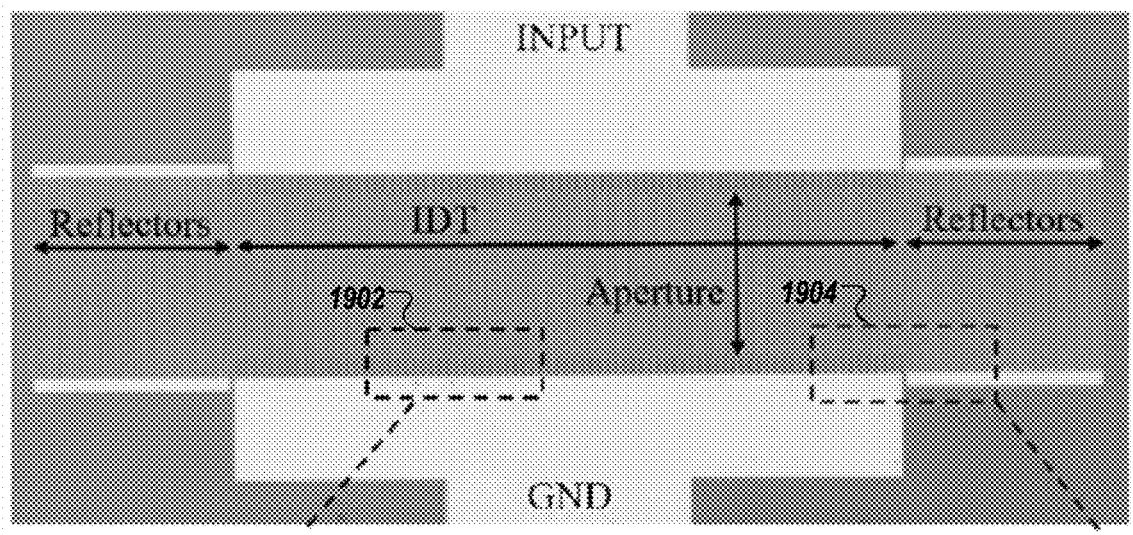
FIG. 19A
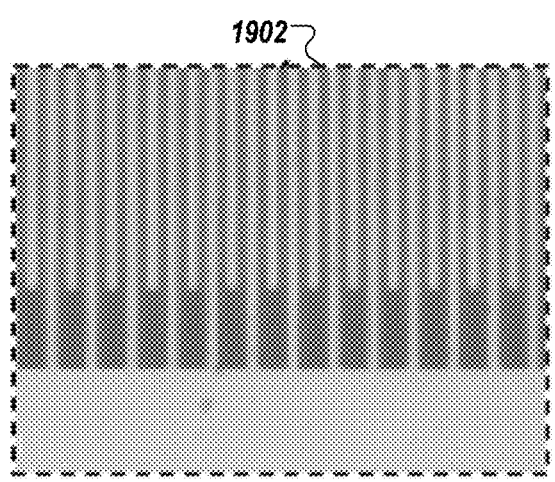 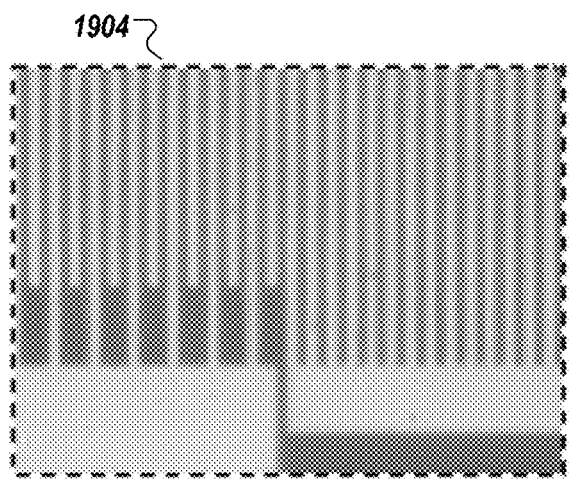
FIG. 19B    FIG. 19C

SURFACE ACOUSTIC WAVE DEVICES USING PIEZOELECTRIC FILM ON SILICON CARBIDE

RELATED APPLICATIONS

This application claims the benefit under 35 U.S.C. § 119(e) of U.S. Provisional Patent Application No. 62/994,967, filed Mar. 26, 2020, which is incorporated herein by this reference in its entirety.

TECHNICAL FIELD

Embodiments of the disclosure relate generally to radio frequency acoustic devices, and more specifically, to surface acoustic wave devices using lithium niobate on silicon carbide.

BACKGROUND

Radio frequency (RF) acoustic devices can be a part of front-ends for emerging applications in fifth generation (5G) and internet of things (IoT). While RF acoustic devices have experienced a quick market growth in the past decade due to an increase number of bands incorporated for long term evolution (LTE) and global compatibilities, developments and advances in the RF acoustic devices are accelerating in anticipation of wider bandwidth and higher frequency requirements of future generations.

BRIEF DESCRIPTION OF THE DRAWINGS

A more particular description of the disclosure briefly described above will be rendered by reference to the appended drawings. Understanding that these drawings only pro vide information concerning typical embodiments and are not therefore to be considered limiting of its scope, the disclosure will be described and explained with additional specificity and detail through the use of the accompanying drawings.

FIG. 1A is a top view of a schematic diagram of an acoustic resonator according to embodiments.

FIG. 1B is a cross-sectional view of a schematic diagram of the acoustic resonator according to embodiments

FIG. 6A is a cross-sectional transmission electron microscope (XTEM) image of a single-crystalline LiNbO$_3$ thin film on 4H-SiC substrate according to embodiments.

FIG. 6B is a high-resolution transmission electron microscope (HRTEM) image of the single-crystalline LiNbO$_3$ thin film at a region 602 on 4H-SiC substrate according to embodiments.

FIG. 6C is an atomic force microscope (AFM) image of a transferred LiNbO$_3$ thin film after inductively coupled plasma (ICP) etching according to embodiments.

FIG. 6D is a graph illustrating an x-ray powder diffraction (XRD) rocking curve for a (110) plane of the transferred LiNbO$_3$ thin film according to embodiments.

FIG. 8A is an optical microscope image of a fabricated SH0 filter according to embodiments.

FIG. 8B is a zoomed-in optical microscope image of a region of the fabricated SH0 filter according to embodiments.

FIG. 8C is a zoomed-in optical microscope image of a region of the fabricated SH0 filter according to embodiments.

FIG. 11A is a graph illustrating a comparison of measured admittance between fabricated SH0 mode resonators based on two types of radio frequency (RF) probes according to embodiments.

FIG. 11B is a graph illustrating a comparison of measured Bode-Q between fabricated SH0 mode resonators based on two types of RF probes according to embodiments.

FIG. 11C is a graph illustrating a comparison of measured impedance between fabricated SH0 mode resonators based on two types of RF probes according to embodiments.

FIG. 11D is a graph illustrating a comparison of measured admittance smith charts between fabricated SH0 mode resonators based on two types of RF probes according to embodiments.

FIG. 19A is an optical microscope image of a fabricated SH0 resonator according to embodiments.

FIG. 19B is a zoomed-in optical microscope image of a region of the fabricated SH0 resonator according to embodiments.

FIG. 19C is a zoomed-in optical microscope image of a region of the fabricated SH0 resonator according to embodiments.

DETAILED DESCRIPTION

Figure 2A:
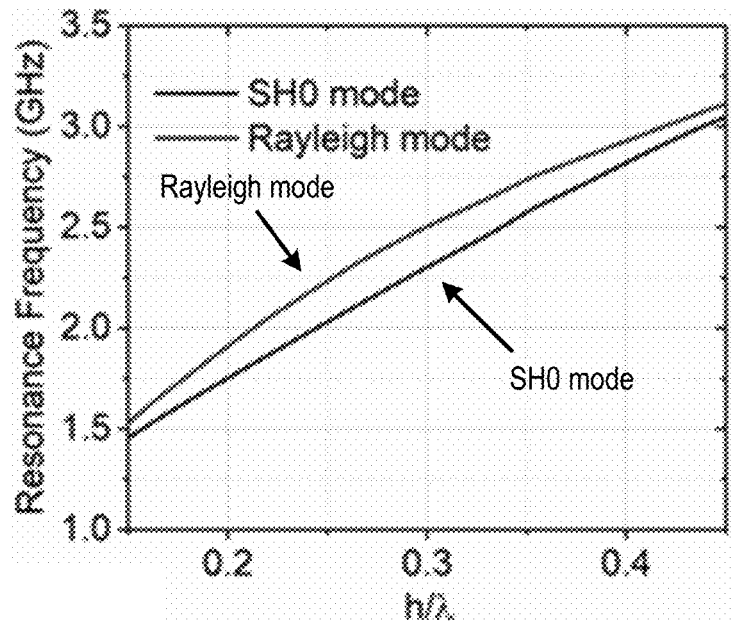
FIG. 2A is a graph illustrating resonance frequency as a function of a ratio of transferred film thickness to wavelength of an excited mode (h/λ) for both a fundamental shear-horizontal (SH0) mode and a Rayleigh mode in a transducer cell on an X-cut lithium niobate (LiNbO$_3$) thin film on a 4H-SiC substrate according to embodiments.

Radio-frequency (RF) acoustic devices are front ends for emerging applications in fifth generation (5G) and internet of things (IoT). While radio frequency (RF) acoustic devices have experienced market growth in the past decade due to an increasing number of bands incorporated for long term evolution (LTE) and global compatibilities, developments and advances in these devices are accelerating in anticipation of wider bandwidth and higher frequency requirements of future generations. One advance in recent years is an acoustic device based on transferred piezoelectric thin films, such as lithium niobate ($LiNbO_3$), lithium tantalate ($LiTaO_3$), or the like. Piezoelectric thin-film devices (e.g., acoustic resonators and/or acoustic filters) can have various forms (e.g., suspended, solid mounted, and the like) and can employ a diversity of modes, e.g., surface acoustic wave (SAW), fundamental shear horizontal (SH0), fundamental symmetric (S0), first-order antisymmetric (A1), and the like over a wide range of frequencies from approximately 1 kilohertz (kHz) to 30 gigahertz (GHz). It should be noted that fundamental refers to a zeroth-order mode.

In one embodiment, devices that use free-standing piezoelectric thin films, such as $LiNbO_3$ or $LiTaO_3$, can achieve high electromechanical coupling and high quality factors (Q-factors), Q. Q-factors can depend on design as well as fabrication. Solidly-mounted (also referred to as unreleased) piezoelectric devices (e.g., incredible high performance (I.H.P), hetero-acoustic layer (HAL), or the like) can feature a more straightforward fabrication process, lower cost, larger power handling, and better linearity. It is worth noting that unreleased devices refer to device with solid material (such as SiC or other carrier substrate) below the piezoelectric thin film. In terms of the material stacks for both types of devices, a transferred piezoelectric thin film on either a $LiNbO_3$ or Si substrate can be used. Occasionally, an intermediate layer of $SiO_2$ for film transfer, device release, or temperature compensation purpose can be included.

For an unreleased device, various substrates, such as silicon (Si), can be used. Si is low in cost and can support confined propagation of SAWs predominantly in $LiNbO_3$ due to the sharp contrast of material properties between Si and $LiNbO_3$ and their implied dispersions. An optimal exploitation of such a material stack can result in better performance. In some embodiments, diamond can be used to obtain better performance. Development on diamond thin film synthesis on Si can help to reduce the cost and widen access. In some embodiments, silicon carbide (SiC) can be used as a substrate, and can have a desirable mix of properties with respect to $LiNbO_3$ (or $LiTaO_3$) and may offer advantages as a substrate. For example, SiC offers large phase velocities for the longitudinal waves (13100 m/s) and shear waves (7100 m/s), a high thermal conductivity (370

W/(m·K)), a dielectric constant which is comparable to the dielectric constant of Si but smaller than the dielectric constant of LiNbO$_3$, and a good frequency and Q-factor (f·Q) product, which can provide for improved device performance and possibly a new type of device for applications in harsh environments.

The potential of using a platform using LiNbO$_3$ (or LiTaO$_3$) piezoelectric thin film on a 4-hexagonal silicon carbide (4H-SiC) substrate is explored. Such a combination can be used to achieve high-performance RF acoustic resonators and acoustic filters (also herein referred simply as resonators and filters, respectively). Such a platform can be designed and prepared by an ion-slicing and wafer bonding process. A fabricated acoustic resonator can have a large effective electromechanical coupling ($k_t^2$) of greater than 20%, for example 26.9%, and a high-quality factor (Bode-Q) of 1228, which can result in a high figure of merit (FoM) (FoM=$k_t^2$·Bode-Q) of 330 at 2.28 GHz. Additionally, the fabricated resonators can have scalable resonances from 1.61 GHz to 3.05 GHz, (e.g., by varying at least one of the wavelength of the intended mode and/or the thickness of the piezoelectric thin film) and impedance ratios between 53.2 dB and 74.7 dB. Filters with the same topology can have center frequencies of 2.16 GHz and 2.29 GHz with sharp roll-off and spurious-free response over a wide frequency range. A filter with a center frequency of 2.29 GHz can have a 3 dB fractional bandwidth (FBW) of 9.9%, an insertion loss (IL) of 1.38 dB, an out-of-band (OoB) rejection of 41.6 dB, a return loss of 10 dB at the center frequency, and a footprint of approximately 0.75 mm$^2$. The fabricated filters can further have a temperature coefficient of frequency (TCF) of −48.2 ppm/° C. and power handling of 25 dBm.

FIG. 1A is a top view of a schematic diagram of an acoustic resonator 100 according to embodiments. FIG. 1B is a cross-sectional view of a schematic diagram of the acoustic resonator 100 according to embodiments Acoustic resonator 100 may be a one-port SAW resonator. Acoustic resonator 100 can include a piezoelectric thin film 102 located on a carrier substrate 104. Piezoelectric thin film 102 can be adapted to confine a fundamental shear horizontal (SH0) surface acoustic wave (SAW) within the piezoelectric thin film. Piezoelectric thin film 102 may be an X-cut LiNbO$_3$ thin film, LiTaO$_3$ thin film, or other suitable thin film. In some embodiments, the piezoelectric thin film may be a Y-cut LiNbO$_3$ thin film. In some embodiments, the piezoelectric thin film may be LiTaO$_3$ and may have various cuts depending on its crystal orientation. In one embodiment, carrier substrate 104 is silicon carbide (SiC). In other embodiments, carrier substrate 104 may be one of LiNbO$_3$, Si, three-cubic (3C)-SiC (polycrystalline), 3C-SiC, four-hexagonal (4H)-SiC, six-hexagonal (6H)-SiC, diamond, sapphire (α-Al$_2$O$_3$), alpha (α)-quartz, or amorphous SiO$_2$. A thickness of piezoelectric thin film 102 is $T_{piezo}$ and a thickness of substrate 104 is $T_{sub}$.

Acoustic resonator 100 can include an input bus line 106 coupled to an input source and a ground bus line 108 coupled to a ground potential. Acoustic resonator 100 can include a grating reflector 110 located at a first end of piezoelectric thin film 102 and coupled between input bus line 106 and ground bus line 108. Acoustic resonator 100 can include a grating reflector 112 located at a first end of piezoelectric thin film 102 and coupled between input bus line 106 and ground bus line 108. Additionally, or alternatively, grating reflectors 110 and 112 can be coupled between the input source and the ground potential not through the input bus line 106 or the ground bus line 108. Grating reflector 110 and grating reflector 112 can be located at opposite ends of piezoelectric thin film 102. Grating reflectors 110 and 112 can each include a number of parallel metal strips. Grating reflectors 110 and 112 have a period $P_r$ which represents a distance between the parallel metal strips. The metal strips have a width $W_r$. Each grating reflector 110 and 112 includes $N_r$ reflector pairs. For example, the parallel metal strips may be an aggregate of parallel metal strips. Grating reflectors can be used to confine acoustic energy and suppress spurious modes, and thus, in some embodiments, a period of grating reflector 110 may be different than a period of grating reflector 112. For example, grating reflector 110 and grating reflector 112 may not have the same designs, and either grating reflector can be designed in various ways to achieve similar effects and confine acoustic energy.

Acoustic resonator 100 can include a set of interdigital transducers (IDTs) 114 located between grating reflector 110 and grating reflector 112. A distance between grating reflector 110 and a first end of the set of IDTs 114 is $W_{ri}$ (e.g., an air gap width). The second end of the set of IDTs 114 is separated from grating reflector 112 by $W_{ri}$. The set of IDTs 114 includes $N_i$ pairs of IDTs. Each IDT 114 can include a signal electrode 116 and a ground electrode 118. Each signal electrode 116 can be coupled to input bus line 106 and each ground electrode 118 can be coupled to ground bus line 108. IDTs 114 can include signal electrodes 116 that are alternated with ground electrodes 118. Signal electrodes 116 can extend distally away from input bus line 106 and ground electrodes 118 can extend distally away from ground bus line 108 Signal electrodes 116 and ground electrodes 118 have a thickness $T_e$ and a width $W_e$. The IDTs 114 have a period $P_i$ which represents a distance between adjacent signal electrodes 116 (or similarly, adjacent ground electrodes 118). Adjacent signal electrodes may be associated with adjacent pairs of ITDs.

A distal end of signal electrode 116 is separated from a distal end of ground electrode 118 by a distance that defines an aperture width ($W_a$) of acoustic resonator 100. The distal end of signal electrode 116 is separated from ground bus line 108 by an air gap width $W_g$. Similarly, the distal end of ground electrode 118 is separated from input bus line 106 by the air gap width. In some embodiments, a ratio of the aperture width $W_a$ to the electrode width $W_e$ is between 20 and 100.

Design parameters are noted on FIGS. 1A-1B. In some embodiments, acoustic resonator 100 is a one-port SAW resonator, e.g., having a single port of one of the grating reflectors. The one-port SAW resonator can be disposed on a hetero-integrated substrate. Parameters are explained in Table 1 below.

TABLE 1

KEY PARAMETERS OF SOLID MOUNTED RESONATORS

| Sym. | Parameter |
|---|---|
| $T_{piezo}$ | Piezoelectric film thickness |
| $T_{sub}$ | Substrate thickness |
| $T_e$ | Electrode thickness |
| $P_t$ | IDT finger period |
| $P_r$ | Reflector finger period |
| $N_t$ | Number of IDT pairs |
| $W_e$ | Electrode width |
| $W_r$ | Reflector width |
| $W_a$ | Aperture width |
| $W_g$ | Air gap width |

TABLE 1-continued

KEY PARAMETERS OF SOLID
MOUNTED RESONATORS

| Sym. | Parameter |
|---|---|
| $W_{ri}$ | Air gap width |
| $N_r$ | Number of reflector pairs |

The top view of the one-port SAW resonator is shown in FIG. 1A, where two grating reflectors are placed at both ends of the interdigital transducers (IDTs). The IDTs may be composed of $N_i$ pairs of electrodes aligned and periodically connected to the busbars, while the grating reflectors may be composed of $N_r$ pairs of electrically-shorted metal strips or electrodes. In one embodiment, the electrodes are metal strips etched on the surface of piezoelectric thin film. In one embodiment, the period $P_r$ of the electrically-shorted electrodes within the grating reflectors can be set to half of the IDT finger period $P_i$ so that the resonant frequencies of the IDT and the grating reflectors align with each other and a desired mechanical reflection can be achieved. In other embodiments, the period $P_r$ of the electrically-shorted electrodes can be approximately half of the IDT finger period $P_i$. The cross-sectional view of the resonator is shown in FIG. 1B, where the single-crystal $LiNbO_3$ thin film can be transferred onto a substrate. Although the performance of this kind of SAW resonator can be affected by a variety of factors, such as its mode of operation, dispersion, electrode configuration, the material properties of the selected substrate, and a variety of device design details, the selected substrate can determine the mode that can be excited and confined, as well as the quality factor, electromechanical coupling, thermal and power handling of the device, and the like.

The relation between material properties and device performance for a given substrate can be analyzed. The following criteria are established regarding the advantages of employing SiC as the substrate material. First, since SiC is a harder material with a lower density than $LiNbO_3$ (or $LiTaO_3$), SiC can support a larger phase velocity compared to the phase velocity of $LiNbO_3$. Because SiC has a large thermal conductivity, SiC can provide capacity for better power handling and a wider temperature range of operation. Because SiC has a low mismatch in coefficient of thermal expansion compared to the coefficient of thermal expansion of $LiNbO_3$ (or $LiTaO_3$), SiC can increase bonding robustness over a wide temperature range. Because SiC has a lower dielectric constant than that of $LiNbO_3$ (or $LiTaO_3$), SiC can improve electric field confinement compared to $LiNbO_3$ (or $LiTaO_3$). Because SiC has low acoustic loss and a large intrinsic f·Q product, if any acoustic fields are present in the SiC substrate material, propagation in the substrate will not induce high loss. Finally, SiC is relatively inexpensive to be used as a substrate.

Table 2 below shows a comparison of material properties of a number of substrates.

TABLE 2

MATERIAL PROPERTIES OF DIFFERENT SUBSTRATES

| Substrates | Density ($kg/m^3$) | Stiffness constants (GPa) | $v_l$ (m/s) | $v_s$ (m/s) | Relative permittivity | Thermal conductivity (W/(m − K)) | Thermal expansion (ppm/° C.) | Cost |
|---|---|---|---|---|---|---|---|---|
| $LiNbO_3$ | 4628 | $C_{11} = 198, C_{44} = 59.7$ | 6541 | 3592 | {45.6, 45.6, 26.33} | 4.2 | {14.4, 15.9, 7.5} | Low |
| Silicon | 2329 | $C_{11} = 166, C_{66} = 79.6$ | 8442 | 5846 | 11.7 | 142 | 2.6 | Very low |
| 3C—SiC (Polycrystaline) | 3210 | $C_{11} = 371, C_{66} = 111$ | 10751 | 5880 | 10.5 | 64 | 4.1 | Low |
| 3C—SiC | 3210 | $C_{11} = 352, C_{66} = 232$ | 10472 | 8501 | 9.7 | 360 | 3.8 | Medium |
| 4H—SiC | 3210 | $C_{11} = 501, C_{44} = 163$ | 12493 | 7126 | {9.7, 10.0} | 370 | {3.1, 3.2} | Medium |
| 6H—SiC | 3210 | $C_{11} = 501, C_{44} = 163$ | 12493 | 7126 | {9.7, 10.0} | 490 | {3.2, 3.3} | Medium |
| Diamond | 3515 | $C_{11} = 1079, C_{66} = 578$ | 17521 | 12823 | 5.9 | 600-2000 | 1.1 | High |
| Sapphire ($\alpha$-$Al_2O_3$) | 3968 | $C_{11} = 490, C_{44} = 145$ | 13113 | 6045 | {9.4, 11.5} | 32.5 | {5.0, 6.6} | Low |
| $\alpha$-quartz | 2649 | $C_{11} = 86.7, C_{44} = 57.9$ | 5721 | 4675 | {3.9, 4.1} | 11.1 | {13.7, 7.5} | Low |
| $SiO_2$ (Amorphous) | 2200 | $C_{11} = 75.0, C_{44} = 22.5$ | 5839 | 3198 | 3.5 | 1.1-1.4 | 0.6 | Low |

The propagation characteristics of longitudinal and shear waves in different crystal materials can be derived and explained. Although the propagation of bulk waves in anisotropic elastic materials can be complicated, the physical quantities of interest are the phase velocities of the slow shear wave ($v_s$) and the slow longitudinal wave ($v_l$). For hexagonal (e.g., 4H-SiC, 6-hexagonal silicon carbide (6H-SiC), and the like) and trigonal (e.g., $LiNbO_3$, Sapphire, $\alpha$-quartz, and the like) materials, the corresponding phase velocities can be approximated by $$v_l \approx \sqrt{c_{11}/\rho} \quad (1)$$

$$v_s \approx \sqrt{c_{44}/\rho} \quad (2)$$

while for cubic (e.g. Silicon, 3-cubic silicon carbide (3C-SiC), diamond, and the like) materials, the corresponding velocities can be approximated by $$v_l \approx \sqrt{c_{11}/\rho} \quad (3)$$

$$v_s \approx \sqrt{c_{66}/\rho} \quad (4)$$

where $c_{11}$ and $c_{44}$ ($c_{66}$) are stiffness constants related to the longitudinal and shear waves, respectively, and $\rho$ is the mass density of the material.

Electrical energy confinement of the intended mode in the thickness direction for a device such as acoustic resonator 100 is related to the dielectric constants of the selected substrate. A lower dielectric constant can provide a higher electromechanical coupling. The mechanical energy confinement can be related to the phase velocities of the shear and the longitudinal bulk waves in the selected substrate. Larger phase velocity, in contrast to the intended mode, can provide better energy confinement. Diamond can be a good material for electrical energy confinement in these respects. Additionally, SiC is a good material, as SiC has a desirable mix of properties with respect to $LiNbO_3$ (or $LiTaO_3$). For example, SiC exhibits large phase velocities for the longitudinal and shear waves, a high thermal conductivity, a lower-than-$LiNbO_3$ dielectric constant, and an f·Q product that can result in enhanced device performance and possibly new types of devices for harsh environment applications. In particular, SiC can offer better frequency scalability, making devices easier to build for a wider frequency range, offer better power handling allowing a device to handle more power before failing, larger fractional bandwidth, and lower insertion loss. Among the various types of SiC, 4H-SiC and 6H-SiC can be advantageous, due to their large thermal conductivities and relative ease of availability.

Figure 2B:
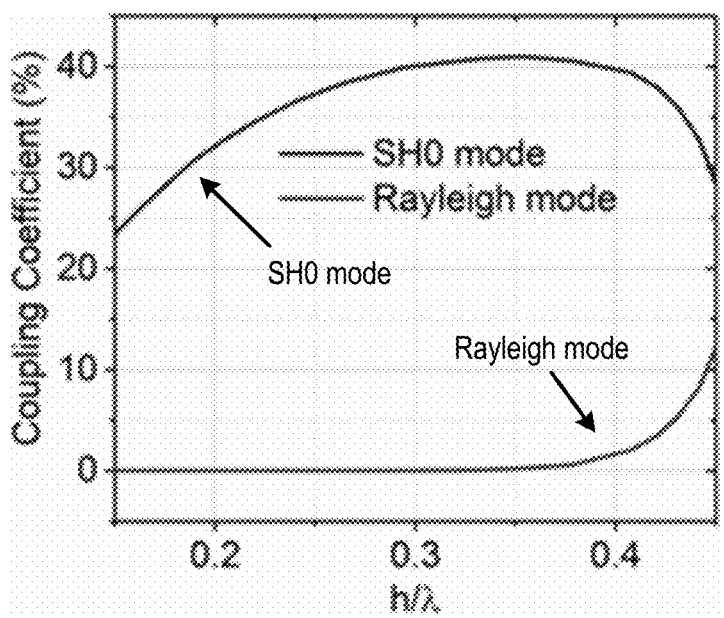
FIG. 2B is a graph illustrating a coupling coefficient $k_t^2$ as a function of h/λ for an SH0 mode and a Rayleigh mode in a transducer cell on an X-cut LiNbO$_3$ thin film on a 4H-SiC substrate according to embodiments.

FIG. 2A is a graph illustrating resonance frequency as a function of a ratio of transferred film thickness to wavelength of an excited mode (h/λ) for both an SH0 mode and a Rayleigh mode in a transducer cell on an X-cut $LiNbO_3$ thin film on a 4H-SiC substrate according to embodiments. FIG. 2B is a graph illustrating a coupling coefficient $k_t^2$ as a function of h/λ for an SH0 mode and a Rayleigh mode in a transducer cell on an X-cut $LiNbO_3$ thin film on a 4H-SiC substrate according to embodiments. In FIGS. 2A-2B, h is the thickness of the transferred $LiNbO_3$ thin film, and λ is the wavelength of the excited mode (SH0 or Rayleigh). A Rayleigh mode, otherwise referred to as a Rayleigh wave, is a type of surface acoustic wave that travels along the surface of a solid. Rayleigh waves can be produced in materials in many ways, such as by a localized impact or by piezoelectric transduction. Rayleigh waves can be used in non-destructive testing for detecting defects.

FIGS. 2A-2B illustrate simulated dispersion curves of the SH0 mode and Rayleigh mode for a hetero-integrated transducer cell with X-cut $LiNbO_3$ thin film on 4H-SiC. A maximum $k_t^2$ orientation is approximately −10° to the +Y-axis. To suppress Rayleigh waves while attaining large $k_t^2$, the propagation direction can be set to −12° to the +Y-axis (e.g., with respect to material coordinate system). As shown in FIG. 2A, when 0.15≤h/λ≤0.45, the resonant frequency of the intended SH0 mode can be lower than that of the Rayleigh mode, which can indicate that the Rayleigh mode shows up as in-band spurious mode. It is worth noting that the phase velocity of the intended SH0 mode can be dispersive and can be related to the ratio h/λ, which can determine the effective stiffness of the $LiNbO_3$ thin film. When 0.15≤h/λ≤0.35, the corresponding coupling coefficient of the intended SH0 mode gradually increases while that of the Rayleigh mode is almost zero. When 0.35≤h/λ≤0.45, the coupling coefficient of the intended SH0 mode gradually decreases while that of the Rayleigh mode gradually increases to 12%, as shown in FIG. 2B. Therefore, to mitigate the effect of the in-band Rayleigh mode of an SH0 mode resonator, h/λ should be set to be less than approximately 0.35.

Figure 3A:
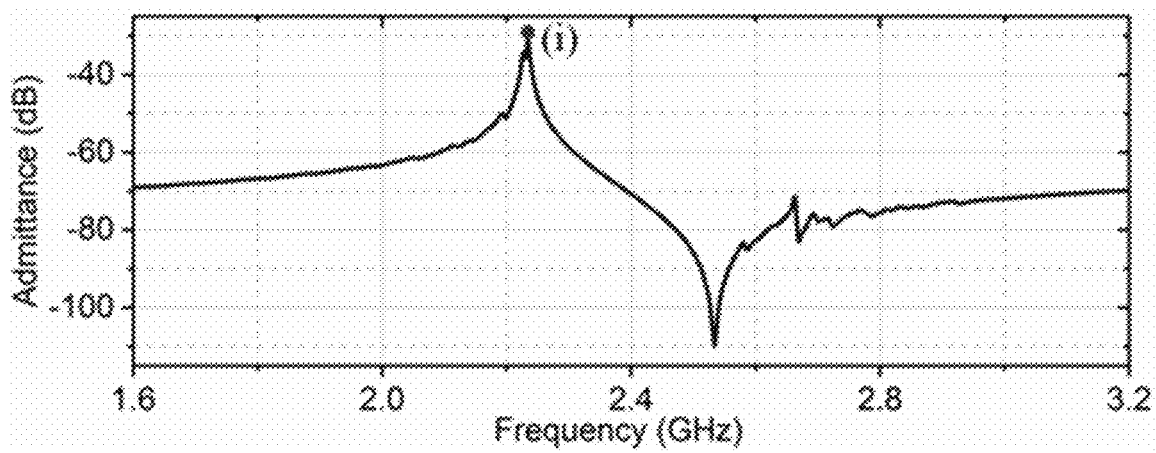
FIG. 3A is a graph illustrating a simulated admittance response of a one-port SH0 mode resonator according to embodiments.

FIG. 3A is a graph illustrating a simulated admittance response of a one-port SH0 mode resonator according to embodiments. Following the above description, the wavelength of the excited mode (e.g., operating wavelength) 2 can be set to be 1.86 μm, and the thickness of the $LiNbO_3$ thin film and the SiC substrate can be set to be 530 nm and 500 μm, respectively. An SH0 mode resonator can be designed with 20 pairs of IDTs and 15 pairs of reflectors on the opposite ends of the IDTs on the $LiNbO_3$-on-SiC substrate. The resonator can be simulated with a three-dimensional (3D) finite element analysis (FEA) (e.g., in COMSOL Multiphysics). As shown, the simulation indicates a resonance of 2.234 GHz and a $k_t^2$ of 35.3% for the intended SH0 mode. The electromagnetic coupling coefficient $k_t^2$ can be given by $$k_t^2 = \frac{\pi^2}{8} * (f_p^2 - f_s^2)/f_s^2 \qquad (5)$$

where $f_s$ and $f_p$ are resonant and anti-resonant frequencies, respectively.

Figure 3B:
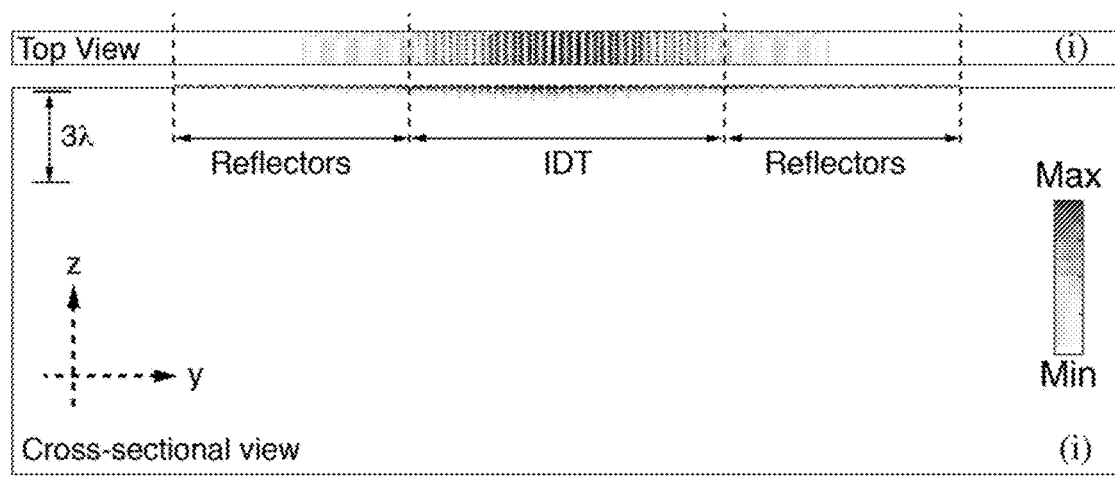
FIG. 3B is a top view and a cross-sectional view of displacement mode shapes at a resonance frequency in the real space domain (y–z) according to embodiments.

FIG. 3B is a top view and a cross-sectional view of displacement mode shapes at a resonance frequency in the real space domain (y-z) according to embodiments. In both FIG. 3B and FIG. 3C the "Max" and "Min" legend can be understood as being associated with electromagnetic energy of the displacement mode shapes. The top view and the cross-sectional view of the displacement mode shapes of the intended SH0 mode in the real space domain (y-z) indicate that the energy of the SH0 mode can be confined in the surface (e.g., in the $LiNbO_3$ film) of the $LiNbO_3$-on-SiC substrate.

Figure 3C:
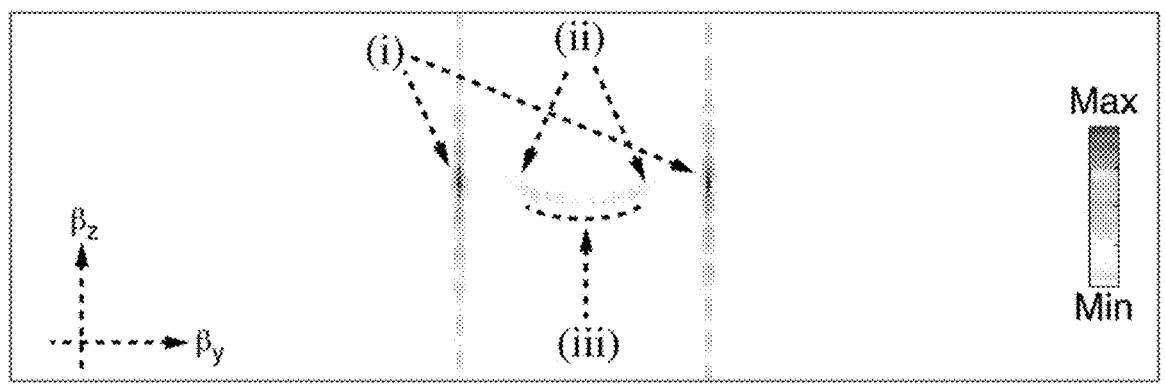
FIG. 3C is a cross-sectional view of displacement mode shapes at a resonance frequency in the wavenumber domain ($\beta_y$–$\beta_z$) according to embodiments.

FIG. 3C is a cross-sectional view of displacement mode shapes at a resonance frequency in the wavenumber domain ($\beta_y$–$\beta_z$) according to embodiments. As shown in FIG. 3C, the displacement vectors (which can be obtained from the FEA) in the real-space domain (y–z) can be converted into the wavenumber domain ($\beta_y$–$\beta_z$) using a calculation method of two-dimensional (2D) fast Fourier transform (2D-FFT). The wavenumber domain can be equivalent to a spatial frequency spectrum, where the separate acoustic wave modes can be visualized, and the characteristics and the relations between the modes can be analyzed. In the wavenumber domain as depicted in FIG. 3C, two lines, denoted by (i), stretch in the z-direction ($\beta_z$-direction), which correspond to the SH0-SAW traveling in the surface area in FIG. 3B. In the center of FIG. 3C, curves of the shear bulk wave responses, denoted by (iii), and the longitudinal bulk wave responses, denoted by (ii), in the SiC substrate are visible. It should be noted that the curves representing the shear (iii) and the longitudinal (ii) waves in the SiC substrate do not contact that of the SH0-SAW (i). This can be due to the large contrast of the phase velocities between the SH0-SAW (i) and the longitudinal waves (ii) as well as between the SH0-SAW (i) and the shear waves (iii). The SH0-SAW can be converted into the shear or the longitudinal waves in the SiC substrate with a large radiation angle. Therefore, bulk wave radiation can be minimally generated and the electromagnetic energy of the SH0-SAW can be maintained in the surface area.

Figure 4:
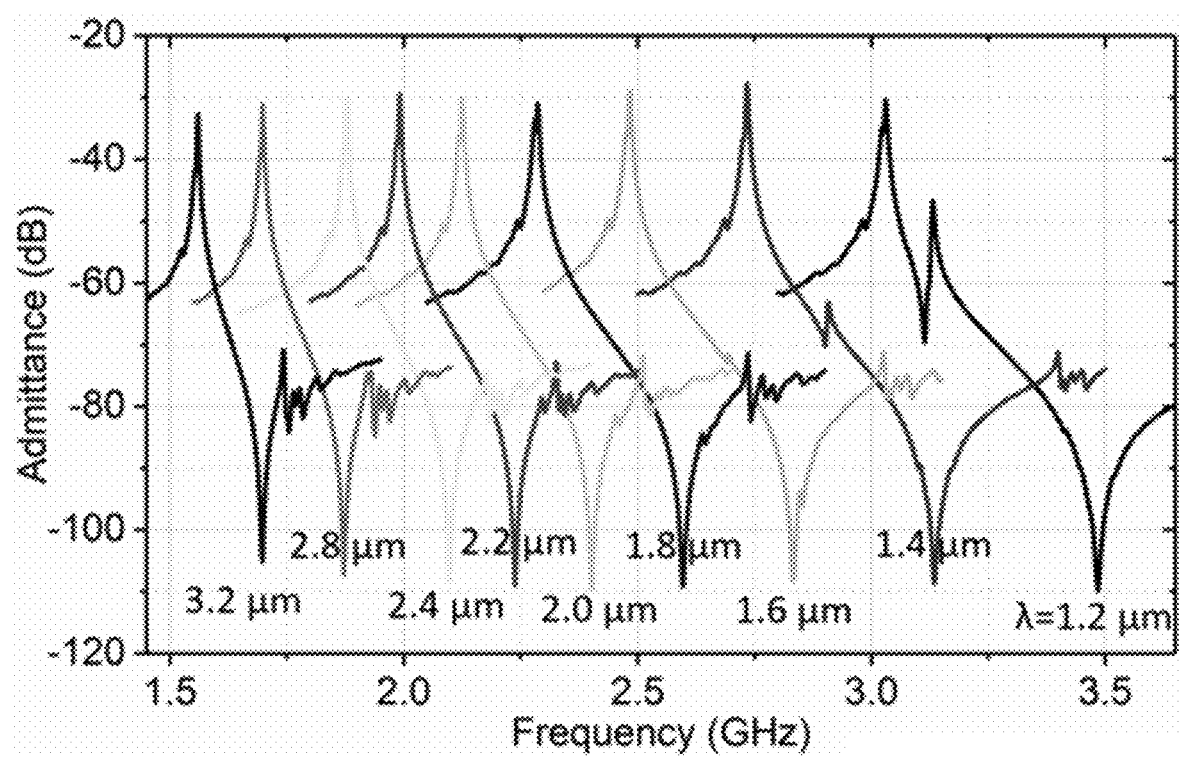
FIG. 4 is a graph illustrating simulated admittance responses of SH0-mode resonators at different wavelengths according to embodiments.

FIG. 4 is a graph illustrating simulated admittance responses of SH0-mode resonators at different wavelengths according to embodiments. In some embodiments, the SH0-mode resonators have a similar device structure to the resonator of FIG. 3B. When λ=1.2 and 1.4 μm (corresponding to h/λ=0.442 and 0.378, respectively), the in-band Rayleigh mode can be strong and the main resonance response of the SH0 mode can be affected, which is consistent with the simulation results shown in FIGS. 2A-2B.

Figures 5A, 5B:
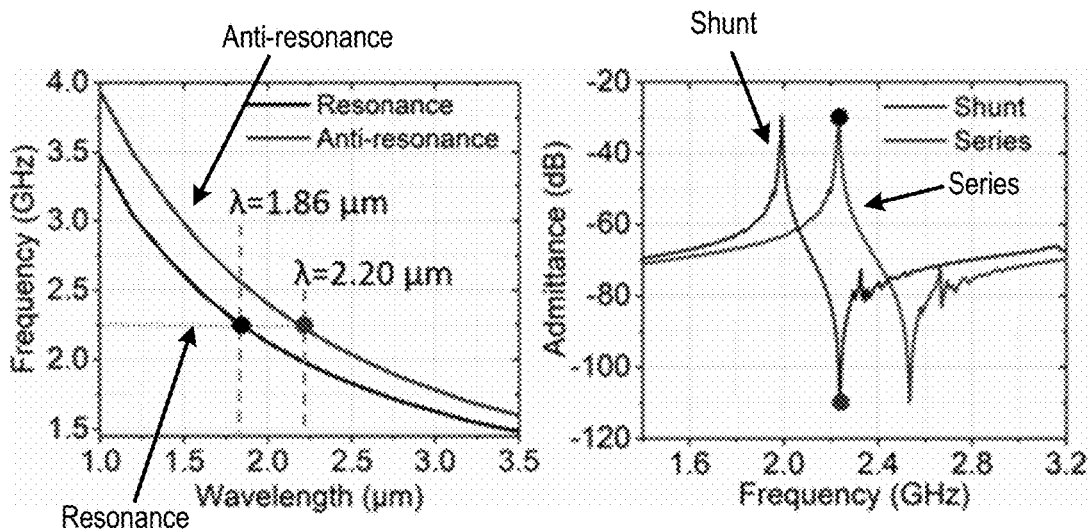
FIG. 5A is a graph illustrating simulated dispersion curves of the SH0 mode in a device with 530 nm thick X-cut LiNbO$_3$ thin film on 4H-SiC substrate according to embodiments.
FIG. 5B is a graph illustrating simulated admittance responses of series and shunt resonators according to embodiments.

FIG. 5A is a graph illustrating simulated dispersion curves of the SH0 mode in a device with 530 nm thick X-cut LiNbO$_3$ thin film on 4H-SiC substrate according to embodiments. A high-order ladder-type filter including of series and shunt resonators as described above can be designed. The resonant frequencies of series and shunt resonators can be designed with a frequency offset between them, which approximately sets the bandwidth of the filter. To achieve a large bandwidth allowed by the $k_t^2$ of the standalone resonators, the offset should approach the spectral separation between the resonances and the anti-resonances. The required frequency offset can be attained by varying the period of the IDT fingers ($P_t$ or $\lambda$) as suggested by the dispersion curves of SH0 mode shown in FIG. 5A. This technique can permit monolithic implementation of multi-frequency resonators required by the ladder topology as well as the lithography-based frequency trimming.

FIG. 5B is a graph illustrating simulated admittance responses of series and shunt resonators according to embodiments. The series and shunt resonators are as described above. The wavelength of the series resonators can be set to 1.86 µm for attaining a filter center frequency of 2.23 GHz, while the wavelength of the shunt resonators can be set to 2.20 µm for attaining the required frequency offset of 250 MHz and for achieving a fractional bandwidth (FBW) greater than 10%.

Figure 5C:
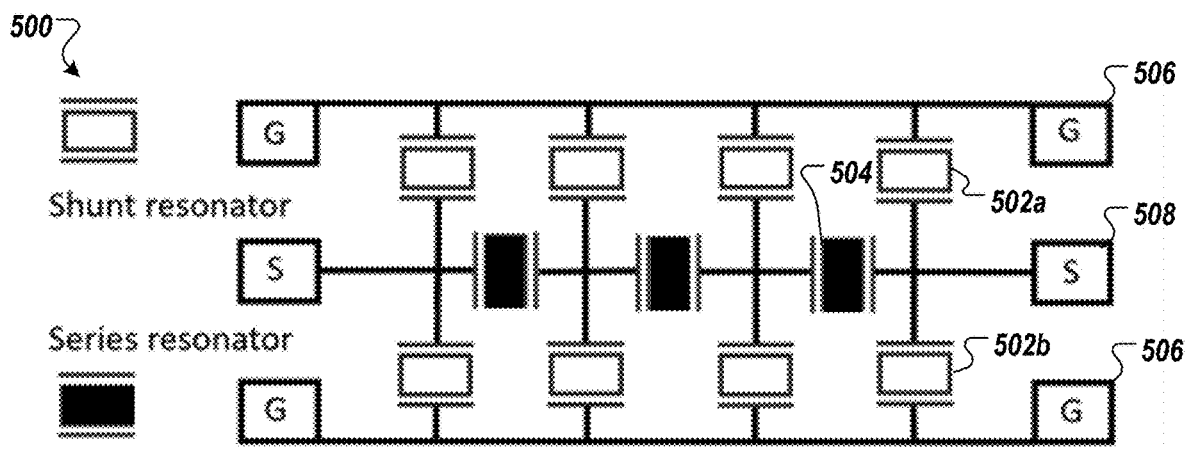
FIG. 5C is a schematic diagram of a high-order ladder-type filter according to embodiments.

FIG. 5C is a schematic diagram of a high-order ladder-type acoustic filter 500 according to embodiments. Acoustic filter 500 can include a ladder step including a shunt resonator 502a coupled to a ground potential 506, a shunt resonator 502b coupled to ground potential 506, and a series resonator 504 coupled between shunt resonators 502a and 502b. Series resonator 504 can also be coupled to an input source 508. Shunt resonators 502 and series resonator 504 may be the same or similar to acoustic resonators 100 of FIG. 1. In some embodiments, acoustic filter may include a second ladder step including two additional shunt resonators 502 that are coupled to the ground potential and one additional series resonator 504 that is coupled between the two additional shunt resonators 502, and to the input source. In further embodiments, acoustic filter 500 can include any number of ladder steps that each include two additional shunt resonators 502 that are coupled to the ground potential and one additional series resonator 504 that is coupled between the two additional shunt resonators 502, and to the input source. For example, each series resonator can be coupled between two input terminals.

Each of shunt resonators 502 and series resonators 504 can include a piezoelectric thin film (such as LiNbO$_3$ or LiTaO$_3$) disposed on a carrier substrate (such as SiC, LiNbO$_3$, Si, 3C-SiC (polycrystalline), 3C-SiC, 4H-SiC, 6H-SiC, diamond, sapphire (α-Al$_2$O$_3$), α-quartz, or amorphous SiO$_2$), a first grating reflector, a second grating reflector, and a set of pairs of IDTs. The piezoelectric thin film can be adapted to confine or propagate an SH0 SAW wave within the piezoelectric thin film. An input bus line coupled to an input source can extend along a longitudinal direction along a length of the piezoelectric thin film. A ground bus coupled to a ground potential can extend along the longitudinal direction along the piezoelectric thin film. The ground bus line may be separated from the input bus line by a transverse distance that is perpendicular to the longitudinal direction.

A first grating reflector may be located at a first end of the piezoelectric thin film, and be coupled between the input bus line and the ground bus line. A second grating reflector may be located at a second end of the piezoelectric thin film, and be coupled between the input bus line and the second bus line. The second grating reflector may be separated from the first grating reflector by a longitudinal distance. The first and second grating reflectors may be made up of parallel aggregate metal strips that are electrically shorted. In other embodiments, the first grating reflector and the second grating reflector may be coupled between the input source and the ground potential.

The IDTs can be located between the first grating reflector and the second grating reflector. Each IDT can include an input electrode and an output electrode. The input electrode may be coupled to an input pad or the input bus line. The output electrode may be coupled to a ground pad or the ground bus line. The input pad may be coupled to the input source and the ground pad may be coupled to the ground source.

Shunt resonators 502 and series resonators 504 of acoustic filter 500 may operate at different frequencies. For example a series resonator may operate at a first frequency and a shunt resonator may operate at a second frequency that is offset from the first frequency. A bandwidth of the acoustic filter may be approximately equal to the offset (e.g., the difference between the first frequency and the second frequency). The offset may be approximately equal to spectral separation between a resonant frequency of the shunt resonator and an anti-resonant frequency of the series resonator. The offset may be set or changed by varying a periodicity of the IDTs.

To make the filter footprint compact and symmetric, each shunt branch can be implemented with two identical resonators in parallel. To attain an adequate static capacitance $C_0$ for matching to 50Ω and a sufficient out-of-band rejection (OoB) of −40 dB, the numbers of the IDT finger pairs can be increased to 44 and 72 for series and shunt resonators, respectively. To mitigate the effect of the transverse modes, the aperture widths ($W_a$) of the series resonators can be set to 19λ, 20λ and 21λ. The key parameters of the series and shunt resonators are listed in Table 3 below.

TABLE 3

KEY PARAMETERS OF SERIES AND SHUNT RESONATORS

| Parameter | $T_e$ (nm) | λ (µm) | $W_e$ (nm) | $W_a$ (λ) | $N_t$ (pair) |
|---|---|---|---|---|---|
| Series resonator 1# | 130 | 1.86 | 465 | 19 | 44 |
| Series resonator 2# | 130 | 1.86 | 465 | 20 | 44 |
| Series resonator 3# | 130 | 1.86 | 465 | 21 | 44 |
| Shunt resonator | 130 | 2.20 | 550 | 22 | 72 |

Figure 5D:
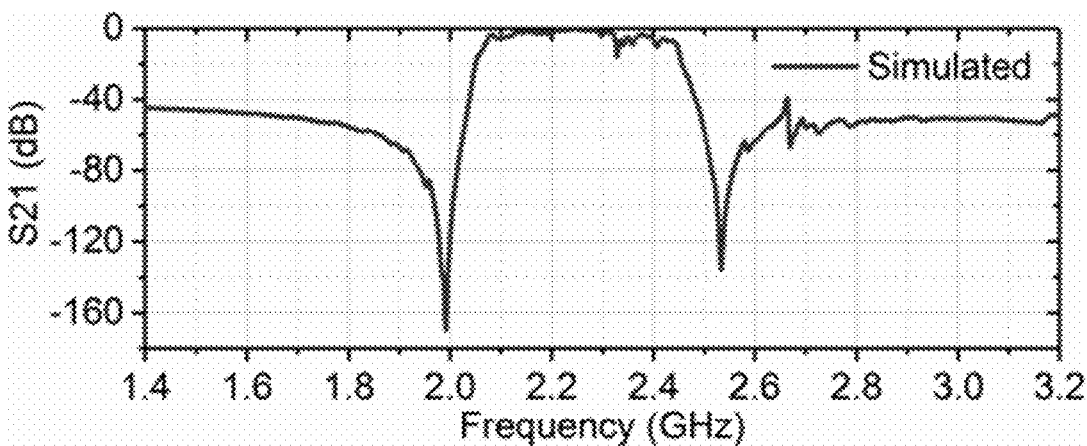
FIG. 5D is a graph illustrating a simulated S-parameter (S21) of a high-order ladder type filter according to embodiments.

FIG. 5D is a graph illustrating a simulated S-parameter (S21) of a high-order ladder type filter according to embodiments. The simulated S-parameter performance (S21) of the high-order filter is shown, exhibiting an OoB of about −40 dB.

FIG. 6A is a cross-sectional transmission electron microscope (XTEM) image of a single-crystalline LiNbO$_3$ thin film on 4H-SiC substrate according to embodiments. FIG. 6B is a high-resolution transmission electron microscope (HRTEM) image of the single-crystalline LiNbO$_3$ thin film at a region 602 on 4H-SiC substrate according to embodiments. The region 602 of FIG. 6B is the region 602 of FIG. 6A. The heterogeneous integration of a single-crystalline LiNbO$_3$ thin film onto a 4H-SiC substrate can be achieved by an ion-slicing processes. A 4-inch LiNbO$_3$ wafer can be implanted with helium ions (He$^+$) at approximately a 7-degree tilt to minimize an ion channeling effect. Then, wafer bonding can be performed (e.g., at approximately 100° C.). The bonded wafer pair can undergo an annealing process so that the implanted He can migrate to induce an exfoliation of the LiNbO$_3$ thin film. A 4-inch LiNbO$_3$ thin film with a thickness of less than 600 nm can be split from the bulk wafer and transferred onto the SiC substrate. Finally, the rough and exfoliated surface can smoothed (e.g., with inductively coupled plasma (ICP) etching). FIG. 6A presents an XTEM image of the fabricated LiNbO$_3$-on-SiC sample. The bonding interface between the LiNbO$_3$ film and the SiC substrate can be investigated by HRTEM, as shown in FIG. 6B. A 3.7 nm amorphous SiO$_2$ layer at the bonding interface may be formed due to the surface oxidation of the SiC. Furthermore, the selected area electron diffraction (SAED) pattern of the transferred LiNbO$_3$ in the inset of FIG. 6B suggests the high crystallinity of the transferred LiNbO$_3$ thin film.

FIG. 6C is an atomic force microscope (AFM) image of a transferred LiNbO$_3$ thin film after inductively coupled plasma (ICP) etching according to embodiments. The AFM image is of the transferred LiNbO$_3$-on-SiC sample, and the uniform root-mean-square (RMS) roughness value less than 2.0 nm can be obtained after ICP etching.

FIG. 6D is a graph illustrating an x-ray powder diffraction (XRD) rocking curve for a (110) plane of the transferred LiNbO$_3$ thin film according to embodiments. The full width at half maximum (FWHM) of the XRD rocking curve of the transferred LiNbO$_3$ can be 122 arc seconds (arcsec) after ICP etching, again confirming the high crystallinity of the LiNbO$_3$ thin film.

Figure 7A:
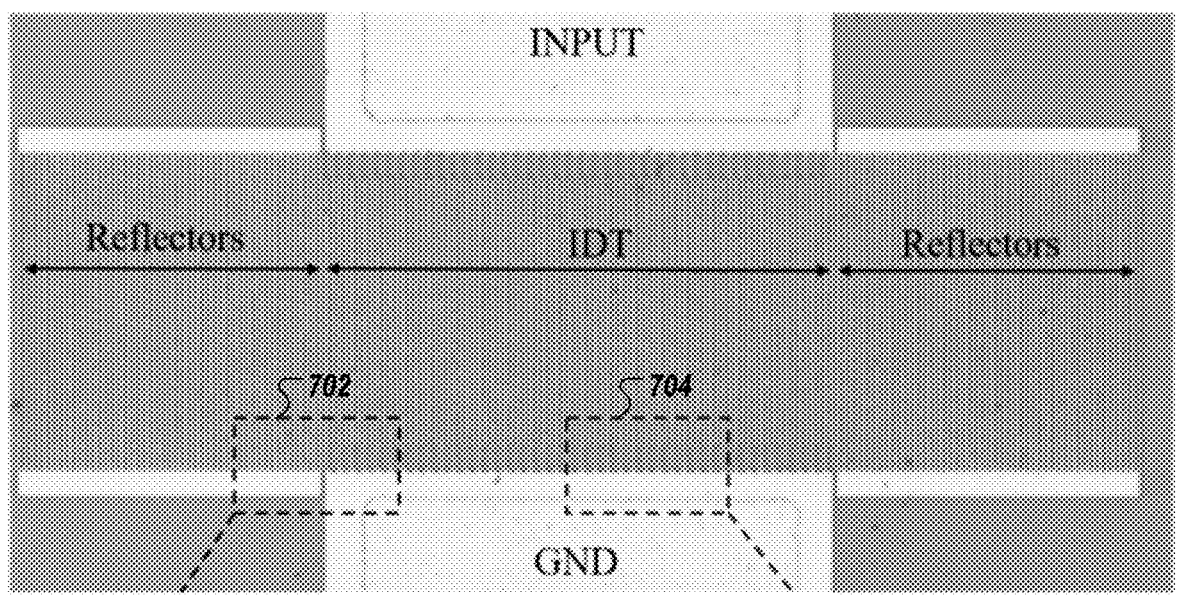
FIG. 7A is an optical microscope image of a fabricated SH0 resonator according to embodiments.
Figures 7B, 7C:
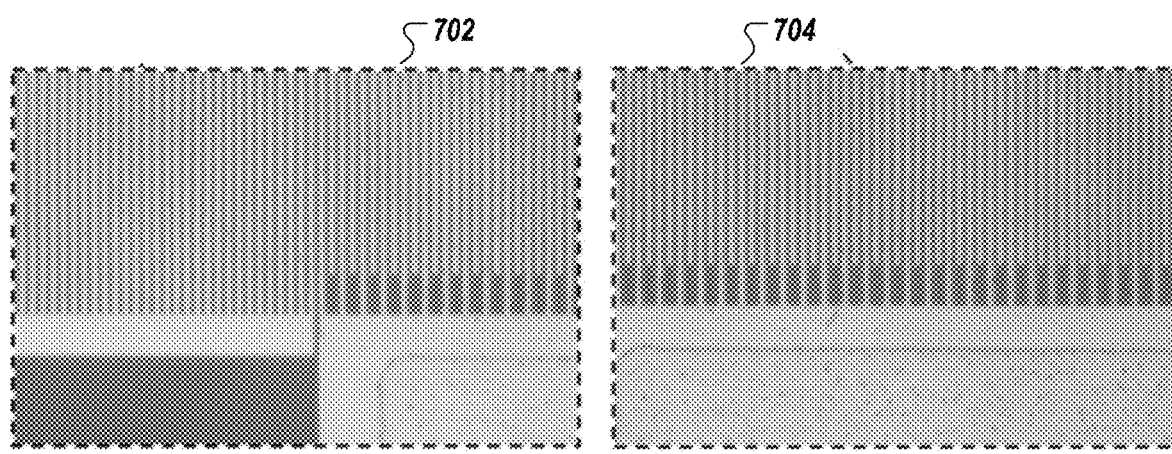
FIG. 7B is a zoomed-in optical microscope image of a region of the fabricated SH0 resonator according to embodiments.
FIG. 7C is a zoomed-in optical microscope image of a region of the fabricated SH0 resonator according to embodiments.

FIG. 7A is an optical microscope image of a fabricated SH0 resonator according to embodiments. FIG. 7B is a zoomed-in optical microscope image of a region of a fabricated SH0 resonator according to embodiments. The region of FIG. 7B is a region 702 of FIG. 7A. FIG. 7C is a zoomed-in optical microscope image of a region 704 of a fabricated SH0 resonator according to embodiments. The region of FIG. 7C is a region 704 of FIG. 7A. The SH0 resonators can be in-house fabricated. The device patterns can be formed by electron beam lithography, aluminum evaporation, and a lift-off process. Photolithography can be performed to open windows in the busbar and pad areas for the evaporation of the second layer of aluminum, followed by the evaporation of the aluminum and the lift-off process. The thickness of the first layer and the second layer of the evaporated aluminum can be made to be 130 nm and 275 nm, respectively. The resonators show good uniformity, and the IDTs and the reflectors are well defined with high fidelity.

FIG. 8A is an optical microscope image of a fabricated SH0 filter according to embodiments. FIG. 8B is a zoomed-in optical microscope image of a region of the fabricated SH0 filter according to embodiments. The region of FIG. 8B is the region 802 of FIG. 8A. FIG. 8C is a zoomed-in optical microscope image of a region of the fabricated SH0 filter according to embodiments. The region of FIG. 8C is the region 804 of FIG. 8A. The filters show good uniformity, and the IDTs and the reflectors are well defined with high fidelity.

Figure 9A:
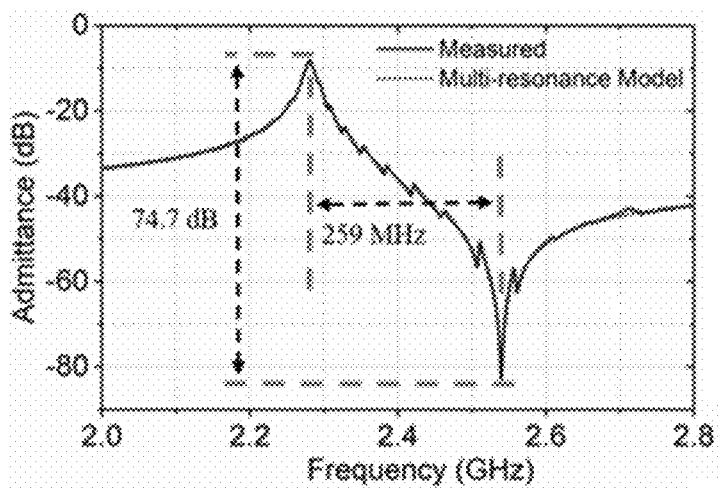
FIG. 9A is a graph illustrating measured and fitted admittance responses of a fabricated SH0 mode resonator according to embodiments.

FIG. 9A is a graph illustrating measured and fitted admittance responses of a fabricated SH0 mode resonator according to embodiments. The fabricated SH0 mode resonator may be the same as the fabricated SH0 mode resonator of FIG. 7.

Figure 9B:
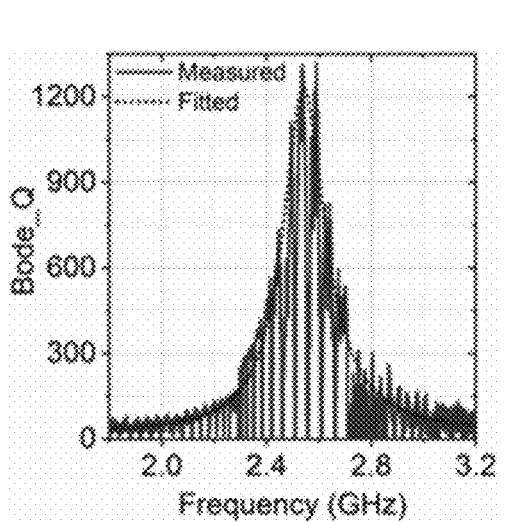
FIG. 9B is a graph illustrating measured and fitted Bode-Q of a fabricated SH0 mode resonator according to embodiments.

FIG. 9B is a graph illustrating measured and fitted Bode-Q of a fabricated SH0 mode resonator according to embodiments. The fabricated SH0 mode resonator may be the same as the fabricated SH0 mode resonator of FIG. 7.

The fabricated SH0 mode resonators can be characterized at room temperature with a network analyzer (such as a Keysight N5249A PNA network analyzer). The measured and fitted admittance responses and the quality factors (Bode-Q) of the resonator are shown in FIG. 9A and FIG. 9B, respectively. As shown in FIG. 9A, the SH0 mode resonator displays an SH0 mode resonance at 2.28 GHz with an extracted $k_t^2$ of 26.9%. The extracted static capacitance $C_0$ and the quality factor at resonance frequency $Q_s$ (based on a multi-resonance model) are listed in Table 4 below.

TABLE 4

| Symbol | $f_s$ | $k_t^2$ | $C_0$ | $Q_s$ | FoM |
|---|---|---|---|---|---|
| Value | 2280 MHz | 0.269 | 815 fF | 154 | 330 |

FIG. 9A also indicates an impedance ratio of 74.7 dB (which can be defined by the impedance at the anti-resonance frequency $f_a$ relative to the impedance at the resonance frequency $f_r$) and a fractional bandwidth of 10.4% (which can be defined by the relative separation between $f_r$ and $f_a$). Several transverse modes can also be seen in the intended resonance, which can be mitigated by tilted resonators or dummy electrodes. The extracted $f_r$ can be slightly lower than the simulated result and the extracted $k_t^2$ can be smaller than the simulated one. A number of factors may contribute to this phenomenon. First, the actual orientation of the device may deviate from the simulated setting. Second, the device can have electrical loss of the electrodes. Finally, the device can support excited transverse modes. FIG. 9B shows a comparison of the measured and fitted Bode-Q and the agreement is good from 1.9 to 3.2 GHz. Periodical deteriorations can also be seen in measured Bode-Q near $f_a$, which can be caused by the presence of transverse modes. From the results of the fitting, the maximum Bode-Q near $f_a$ can be estimated as 1228, hence resulting in a high FoM of 330 at 2.28 GHz.

A comparison between the above resonator and other mounted acoustic resonators is shown in Table 5 below. The fabricated SH0 resonators described herein demonstrated a high $k_t^2$ and Bode-Q.

TABLE 5

COMPARISON OF SOLID MOUNTED ACOUSTIC RESONATORS

| Substrate | $k_t^2$ (%) | $Q_{max}$ | $f_r$ (GHz) | FoM | ML |
|---|---|---|---|---|---|
| LiTaO$_3$ | 8.0 | 1050 | 1.9 | 84 | N |
| LiNbO$_3$ | 7.0 | 1070 | 1.0 | 75 | N |
| LiNbO$_3$ on Si | 7.5 | 1700 | 1.6 | 128 | N |
| LiTaO$_3$ on ML | 9.8 | 4200 | 1.9 | 411 | Y |
| LiNbO$_3$ on ML | 24.7 | 665 | 3.5 | 164 | Y |
| LiNbO$_3$ on SiC | 26.9 | 1228 | 2.2 | 330 | N |

Figure 10A:
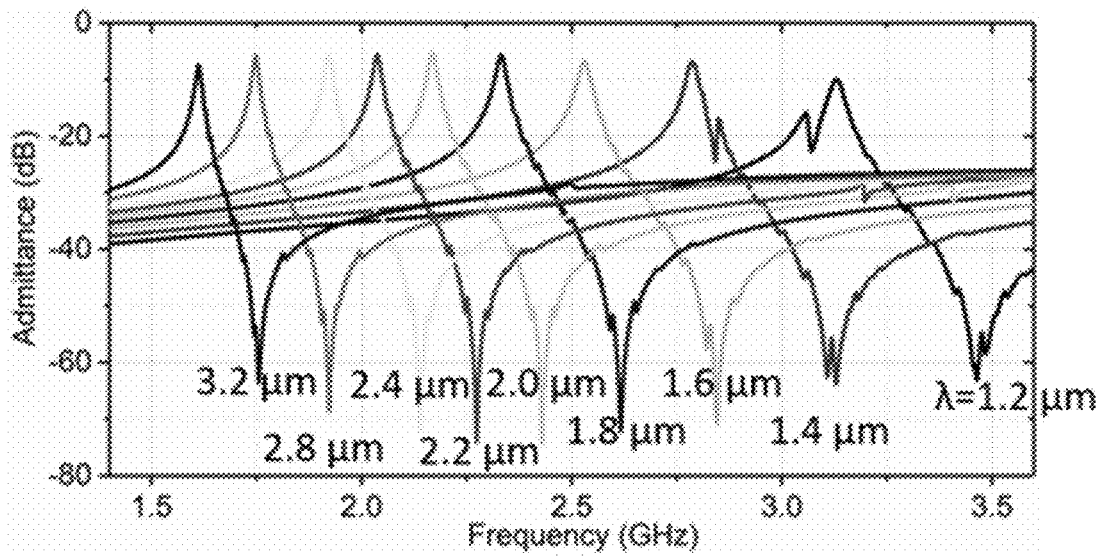
FIG. 10A is a graph illustrating measured admittance responses of fabricated SH0 mode resonators with different wavelengths according to embodiments.

FIG. 10A is a graph illustrating measured admittance responses of fabricated SH0 mode resonators with different wavelengths according to embodiments. The fabricated SH0 mode resonators with an IDT periodicity (λ) from 1.2 to 3.2 μm are plotted. In devices with λ=1.2, and 1.4 μm, the Rayleigh wave is can be obvious, and its resonance can be close to that of the intended SH0 wave. Increasing λ, that is, decreasing h/λ, can mitigate the effect of Rayleigh waves, as suggested in FIG. 2B.

Figure 10B:
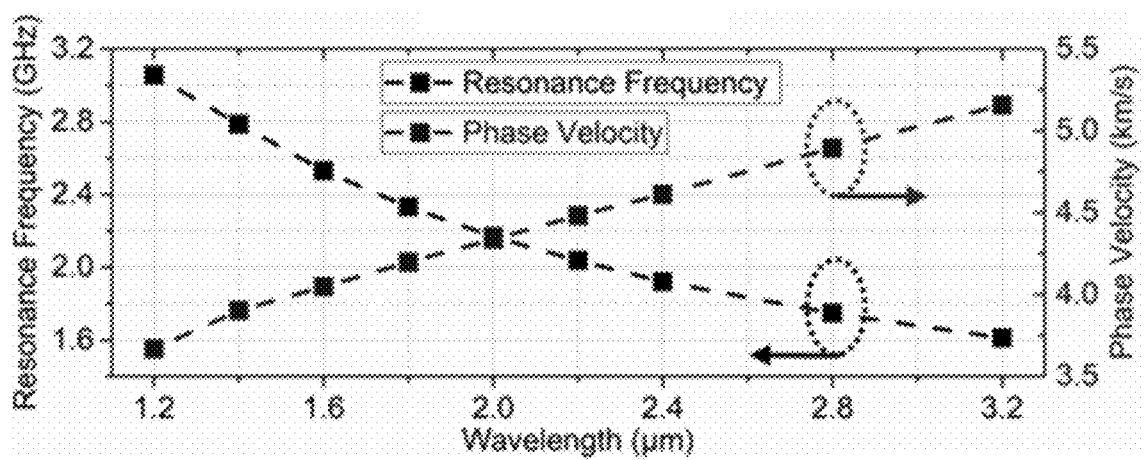
FIG. 10B is a graph illustrating resonance frequencies and phase velocities of fabricated SH0 mode resonators with different wavelength according to embodiments.

FIG. 10B is a graph illustrating resonance frequencies and phase velocities of fabricated SH0 mode resonators with different wavelengths according to embodiments FIG. 10B shows the resonances of the fabricated resonators with different λ, ranging from 1.61 to 3.05 GHz, as well as the phase velocities, ranging from 3667 to 5158 m/s.

Figure 10C:
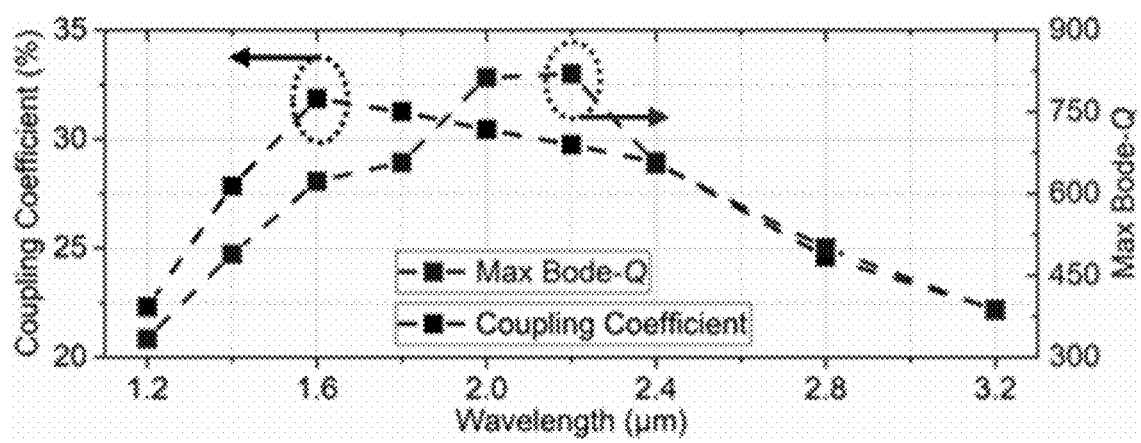
FIG. 10C is a graph illustrating electro-mechanical coupling ($k_t^2$) coefficients and quality factors (Bode-Q) of fabricated SH0 mode resonators with different wavelengths according to embodiments.

FIG. 10C is a graph illustrating electro-mechanical coupling ($k_t^2$) coefficients and quality factors (Bode-Q) of fabricated SH0 mode resonators with different wavelengths according to embodiments. The variation of the $k_t^2$ can be caused by the SH0 wave dispersion in a thin plate of $LiNbO_3$ and the energy leakage to the SiC substrate when λ is relatively large. As λ increases, the maximum Bode-Q increases first and then decreases. The increase in the maximum Bode-Q can be related to electrical loss. Note that these resonators can be fabricated by a lift-off process, and a smaller 2 corresponds to a narrower finger (e.g., IDT) width. Therefore, the evaporated electrodes of narrower width may have larger resistivity, which can cause a greater electrical loss. Additionally, the surface roughness may cause more severe scattering of the SH0 waves when 2 is relatively small. The decrease in the maximum Bode-Q may be caused by the energy leakage to the SiC substrate when λ is relatively large.

Figure 10D:
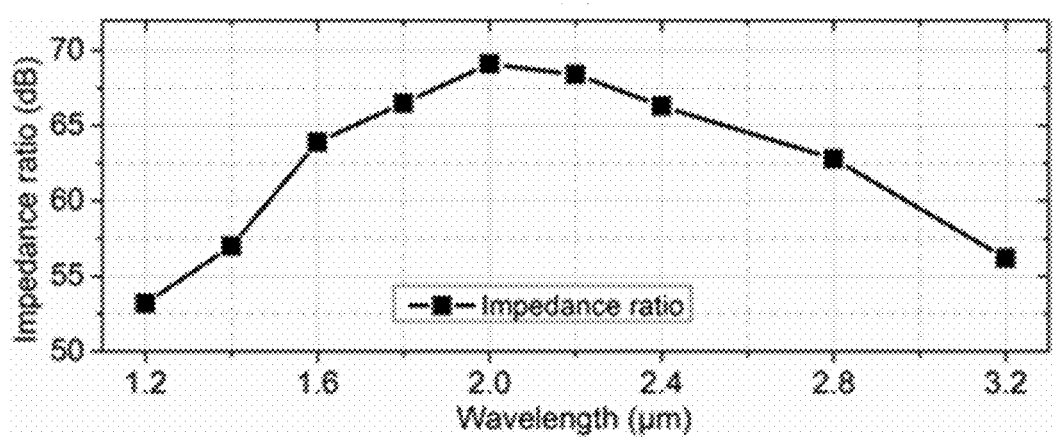
FIG. 10D is a graph illustrating impedance ratios of fabricated SH0 mode resonators with different wavelength according to embodiments.

FIG. 10D is a graph illustrating impedance ratios of fabricated SH0 mode resonators with different wavelengths according to embodiments. FIG. 10D shows the measured impedance ratios of the fabricated resonators with different λ, which indicates that as λ increases, the impedance ratio increases first and then decreases, which has a similar trend as the maximum Bode-Q. The factors that caused the variation of the maximum Bode-Q may also cause the variation of the impedance ratio.

FIG. 11A is a graph illustrating a comparison of measured admittance between fabricated SH0 mode resonators based on two types of RF probes according to embodiments. FIG. 11B is a graph illustrating a comparison of measured Bode-Q between fabricated SH0 mode resonators based on two types of RF probes according to embodiments. FIG. 11C is a graph illustrating a comparison of measured impedance between fabricated SH0 mode resonators based on two types of RF probes according to embodiments. FIG. 11D is a graph illustrating a comparison of measured admittance smith charts between fabricated SH0 mode resonators based on two types of RF probes according to embodiments.

In reference to FIGS. 11A-11D, aluminum electrodes are used for the fabricated SH0 mode resonators. The aluminum electrodes can have a thin layer of aluminum oxide, which can introduce contact resistance in probe-based measurements. Unless a strain-gauge embedded probe is adopted, the contact resistance varies from one probe landing to another, thus resulting in uncertainties in the calibration and making accurate RF measurements of small impedance very difficult.

The comparisons are based on two types of RF probes: the first with tips made of beryllium-copper (BeCu) and the second with tips made of tungsten (W). It should be noted that all the measurement results shown in FIGS. 9-10 were attained with the BeCu probes, which can provide more stable and repeatable results. On the other hand, the stiffness of tungsten can be approximately three times greater than that of BeCu. Therefore, the tungsten probes can break the aluminum oxide layers more easily. When sufficient contact pressure is applied, the tungsten probe can punch through the aluminum oxide layers good electrical contact with the acoustic device aluminum, which can lead to a reduction of the impedance and the Q loading effect from the poor contact.

As shown in FIG. 11A, the admittance at the resonant frequency can increase from −4.79 dB to 3.26 dB, while, as shown in FIG. 11C, the corresponding impedance can be reduced from 1.64Ω to 0.65Ω when switching from BeCu to W. FIG. 11D shows that the measured Q-circle can also show the same effect. It indicates that the Q of the presented resonator can be high. As evidenced in FIG. 11B, the measured Q is 2000, almost twice the value attained with BeCu. BeCu may offer more consistent results which may be due to a reduced amount of aluminum and aluminum oxide that is picked up by the BeCu.

Figure 12A:
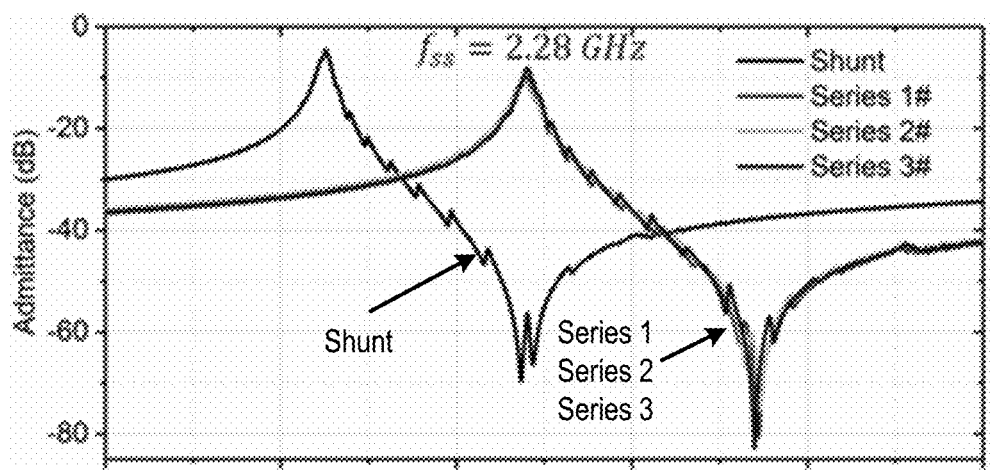
FIG. 12A is a graph illustrating measured admittance responses of series and shunt resonators according to embodiments.

FIG. 12A is a graph illustrating measured admittance responses of series and shunt resonators according to embodiments. The measurements can be performed with a 50Ω system impedance. The measurements are performed on the fabricated filters of FIG. 8. Extracted parameters of the shunt resonator and the series (3 #) resonator based on a modified Butterworth-Van Dyke (MBVD) model are listed in Table 6 below.

TABLE 6

EXTRACTED PARAMETERS OF SHUNT AND SERIES RESONATORS

| Parm. | $f_s$ (GHz) | $k^2$ (%) | $L_m$ (nH) | $R_m$ (Ω) | $C_m$ (fF) | $C_0$ (fF) | $R_s$ (Ω) | $R_0$ (Ω) |
|---|---|---|---|---|---|---|---|---|
| Shunt | 2.05 | 27.6 | 19.3 | 0.293 | 312 | 1395 | 1.6 | 0 |
| Series | 2.28 | 26.9 | 27.4 | 0.357 | 178 | 815 | 2.0 | 0 |

As shown in FIG. 12A, although the measured resonance frequency of the series resonators is slightly higher than the simulated value, the resonant frequency offset is well achieved. Additionally, comparing the admittance curves of the three series resonators indicates that the transverse modes of the same order can be staggered from each other because of the variation of the aperture as shown in Table 3.

Figure 12B:
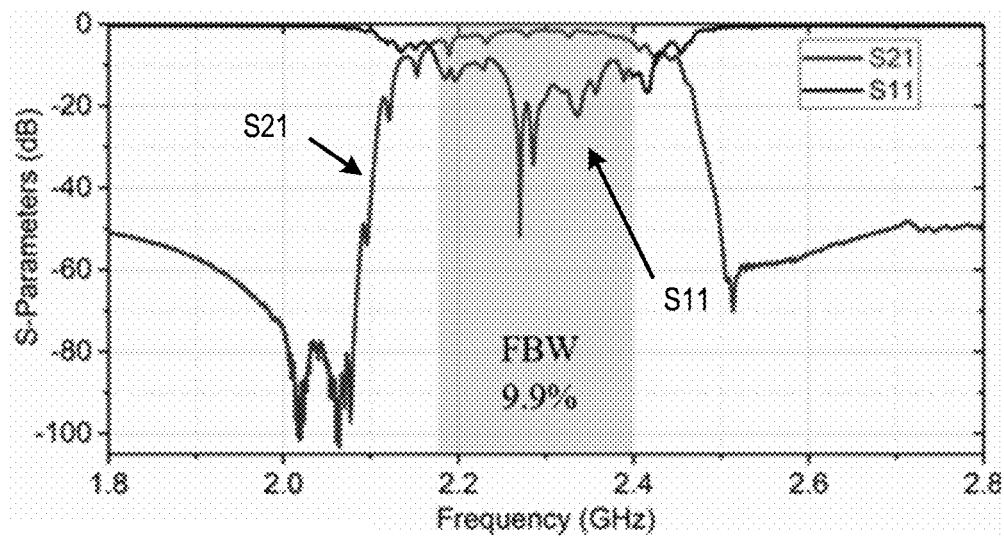
FIG. 12B is a graph illustrating measured S-parameter performance of a fabricated filter in a frequency range of 1.8 GHz to 2.8 GH according to embodiments.

FIG. 12B is a graph illustrating measured S-parameter performance of a fabricated filter in a frequency range of 1.8 GHz to 2.8 GH according to embodiments. The measured S21 and S11 of the filter are shown, which shows an IL of 1.38 dB, a 3 dB FBW of 9.9%, and out-of-band rejection of 41.6 dB at 1.0 GHz from the center frequency. The measured return loss at the center frequency is 10 dB, showing a good match to 50Ω without using any helper circuits. The measured return loss can be decreased by the in-band ripples (transverse modes).

Figure 12C:
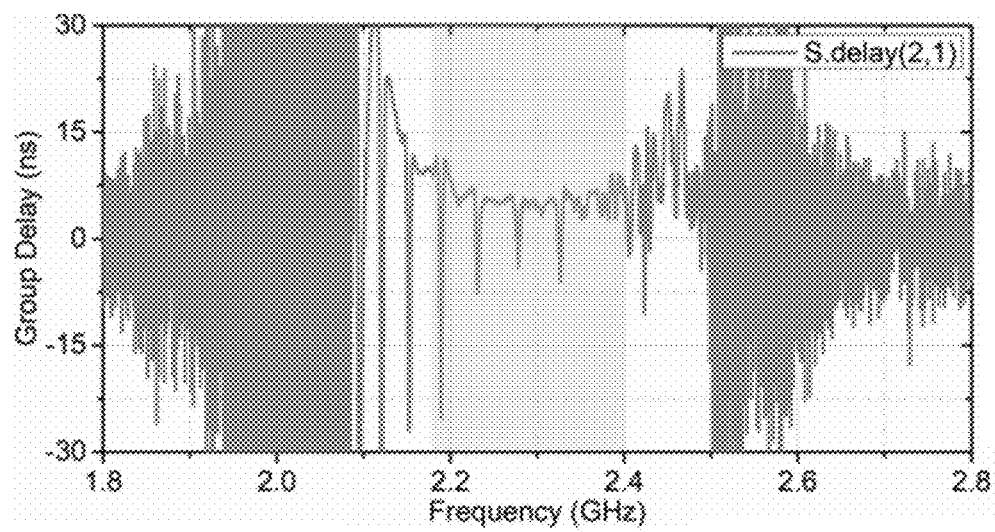
FIG. 12C is a graph illustrating a measured group delay response of the fabricated filter according to embodiments.

FIG. 12C is a graph illustrating a measured group delay response of the fabricated filter according to embodiments. The in-band group delay is less than 12 ns, but may have variations that can cause some distortion in the RF signals. The group delay ripples may be induced by transverse spurious modes of the series and shunt resonators. Some methods may be used to mitigate or suppress the transverse modes, such as apodized IDT electrodes, dummy electrodes, titled transducers, and the like.

Figure 12D:
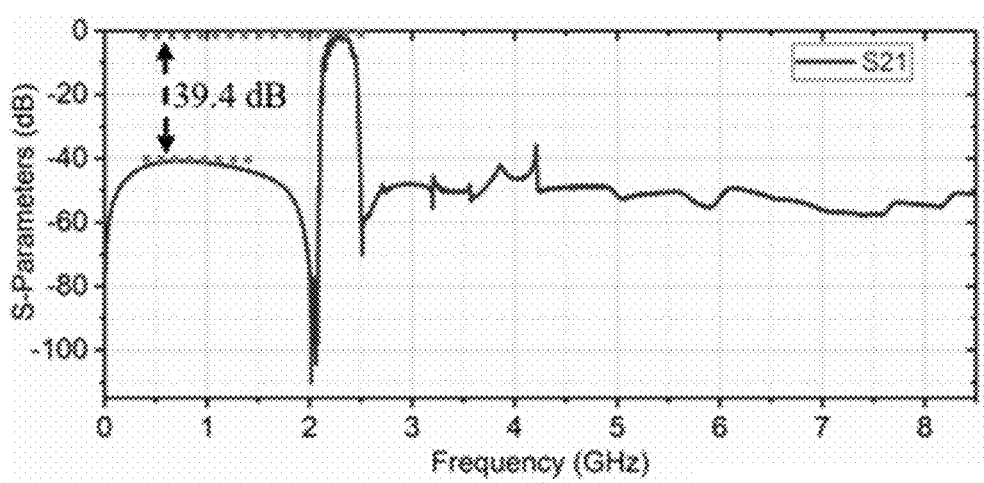
FIG. 12D is a graph illustrating measured S-parameter performance of a fabricated filter in a frequency range from 10 MHz to approximately 8.5 GHz according to embodiments.

FIG. 12D is a graph illustrating measured S-parameter performance of the fabricated filter in a frequency range from 10 MHz to approximately 8.5 GHz according to embodiments. The fabricated filter can have a spurious-free response over a wide frequency range from 10 MHz to 8.5 GHz, as shown. Comparing the magnitude of the in-band IL ripples on the left and right parts, indicates that shifting the same order transverse modes of the build in resonators can help to mitigate the in-band ripples. Although the magnitude of the in-band IL ripples can be relatively large due to the strong transverse modes, the filter described herein still shows good performance.

Figure 13A:
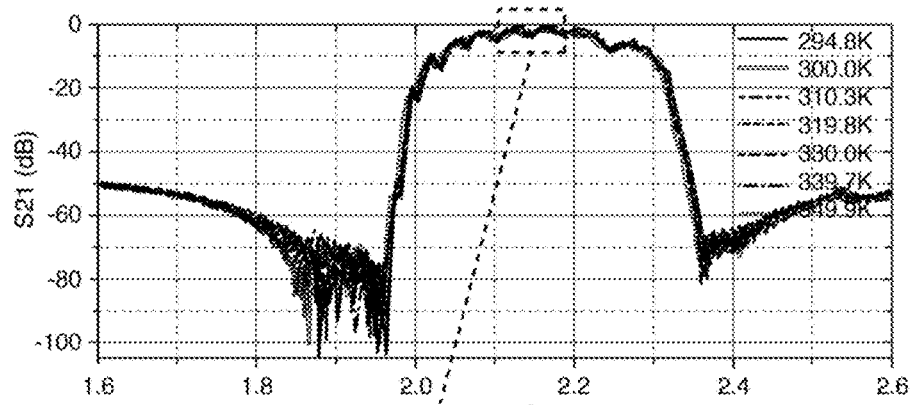
FIG. 13A is a graph illustrating insertion loss (IL) temperature characteristics of a fabricated filter according to embodiments.
Figure 13B:
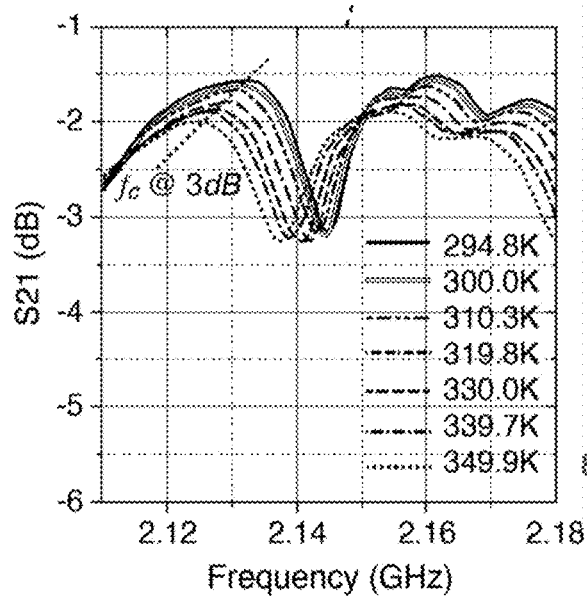
FIG. 13B is a zoomed-in view of a graph illustrating IL temperature characteristics of a fabricated filter according to embodiments.

FIG. 13A is a graph illustrating IL temperature characteristics of a fabricated filter according to embodiments. FIG. 13B is a zoomed-in view of a graph illustrating IL temperature characteristics of a fabricated filter according to embodiments. The fabricated filter may be the filter with the topology as shown in FIG. 5C. The filter can have a center frequency of 2.12 GHz and can be measured at different temperatures, ranging from 295 to 350 K. As shown in FIG. 13A and FIG. 13B, the passband can drift to lower frequencies due to the negative temperature coefficient of stiffness of the $LiNbO_3$ thin film and the SiC substrate.

Figure 13C:
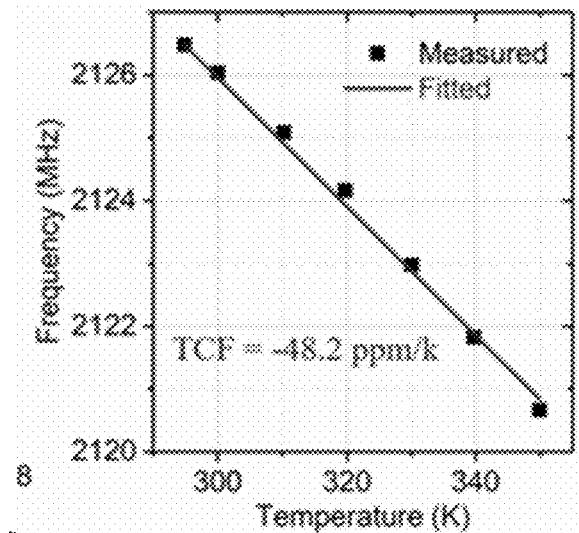
FIG. 13C is a graph illustrating a center frequency and extracted temperature coefficient of frequency (TCF) in a temperature range of 295-350 K according to embodiments.

FIG. 13C is a graph illustrating a center frequency and extracted TCF in a temperature range of 295-350 K according to embodiments. The temperature coefficient of the center frequency (TCF) is plotted in FIG. 13C, showing a fitted TCF around approximately −48.2 ppm/K. The result shows good linearity over the measured frequency range.

A comparison between the fabricated filter (with a center frequency of 2.29 GHz) and other solid mounted acoustic filters is shown in Table 7 below.

TABLE 7

COMPARISON OF SOLID MOUNTED ACOUSTIC FILTERS

| Substrate | $f_c$ (GHz) | FBW (%) | IL (dB) | OoB (dB) | TCF (ppm/k) |
|---|---|---|---|---|---|
| $LiNbO_3$ | 2.49 | 6.2 | 3.5 | 20.0 | / |
| $LiNbO_3$ on Diamond-Silicon* | 2.32 | 1.0 | 28.0 | 20.0 | / |
| $LiTaO_3$ on ML | 1.88 | 4.8 | 0.8 | 35.0 | −8.0 |
| $LiTaO_3$ on ML | 2.44 | 4.1 | 0.9 | 45.0 | / |
| $LiNbO_3$ on SiC | 2.29 | 9.9 | 1.38 | 41.6 | −48.2 |

*Sputtered $LiNbO_3$ thin films on the diamond-coated silicon, in which the diamod films are also sputtered.

The fabricated filter described herein can demonstrate a quite large FBW and a good IL with respect to an OoB rejection of 41.6 dB. $LiTaO_3$ on multi-layered (ML), single-crystal $LiTaO_3$ films can be bonded to ML substrates, in which an intermediate layer of $SiO_2$ can be applied for temperature compensation. Due to the smaller TCF of $LiTaO_3$ (compared to $LiNbO_3$) and the temperature compensation layer, the filter built on the $LiTaO_3$-on-ML substrate exhibits a good TCF. However, $LiTaO_3$ itself has weaker electro-mechanical coupling than $LiNbO_3$, which can limit the bandwidth of $LiTaO_3$-based devices, thus limiting its application in the growing wideband applications. For $LiNbO_3$ on diamond-silicon, $LiNbO_3$ films can be sputtered on diamond-coated silicon substrates. Due to the limited crystalline quality of the sputtered $LiNbO_3$ films and the diamond films, the diamond-silicon filter can show poorer performance compared to $LiNbO_3$ on SiC, which highlights the ion-slicing and the wafer bonding processes.

Figure 14:
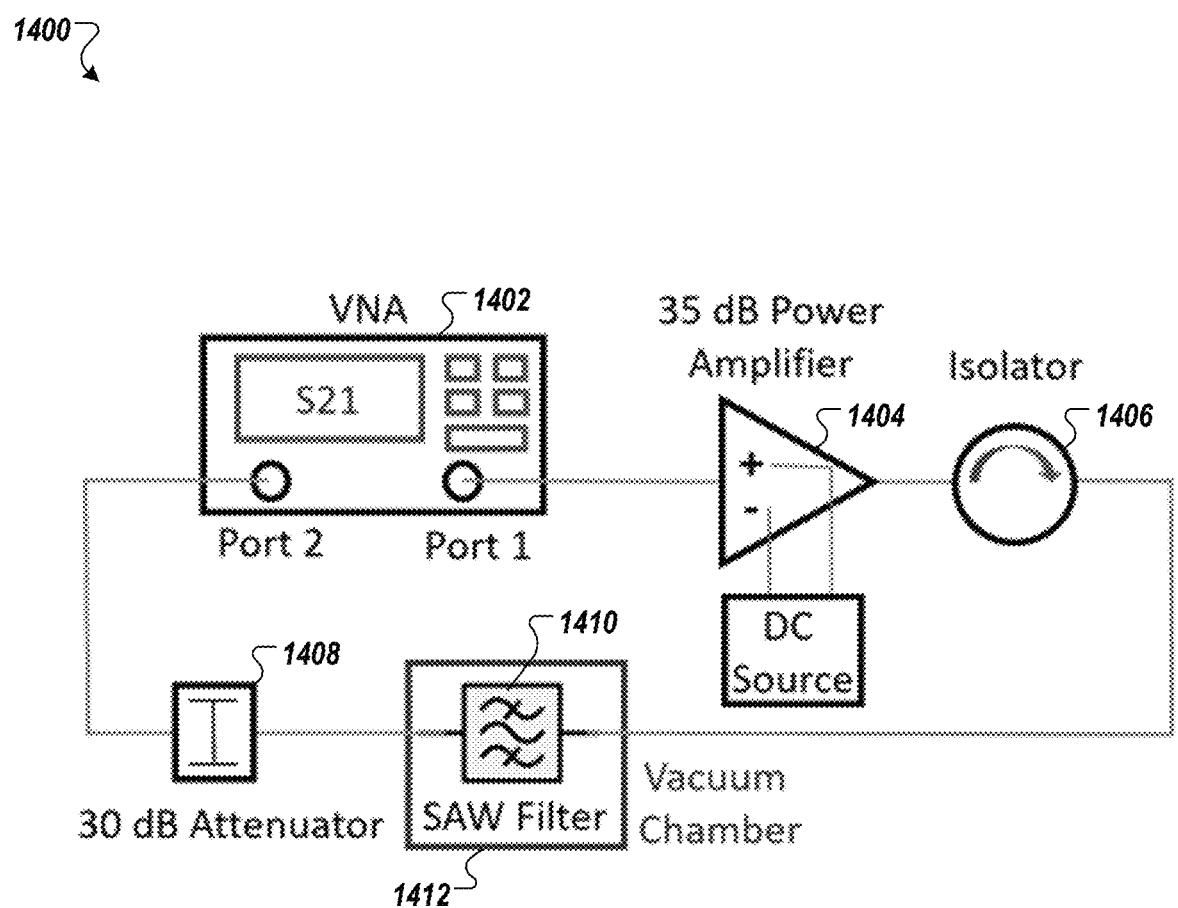
FIG. 14 is a schematic diagram of a setup for a power handling measurement according to embodiments.

FIG. 14 is a schematic diagram of a setup for a power handling measurement according to embodiments. The power handling circuit can include a vector network analyzer (VNA) 1402 to measure S-parameters, such as S21. An input of a power amplifier 1404 can be coupled to a first port of the VNA 1402. An output of the power amplifier can be coupled to an isolator 1406. An attenuator 1408 can be coupled to a second port of the VNA 1402. A SAW filter 1410 (such as an SH0 SAW acoustic filter as described herein) can be coupled between the isolator and the attenuator, and be disposed within a vacuum chamber 1412. The power handling measurement can be used to test how a fabricated filter reacts to measurements at high power. The measured power handling performance is shown in FIGS. 15A-15B.

Figures 15A, 15B:
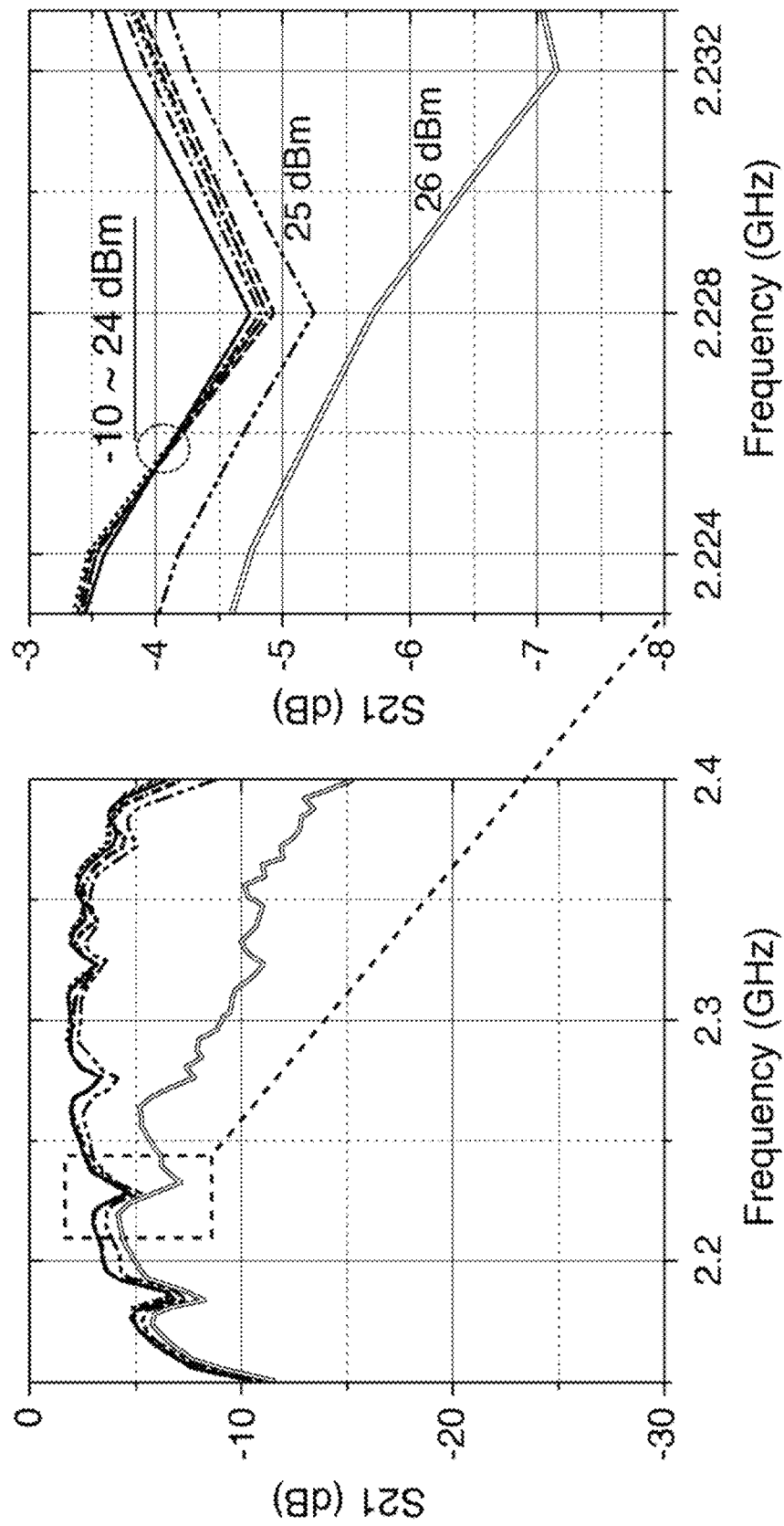
FIG. 15A is a graph illustrating a measured S21 power handling performance of a fabricated filter according to embodiments.
FIG. 15B is a graph illustrating a zoomed-in view of a measured S21 power handling performance of the fabricated filter according to embodiments.

FIG. 15A is a graph illustrating a measured S21 power handling performance of a fabricated filter according to embodiments. FIG. 15B is a graph illustrating a zoomed-in view of the measured S21 power handling performance of the fabricated filter according to embodiments. As shown in FIG. 15B, when the power applied to the filter increases from −10 to 24 dBm, the variation of S21 can be less than 0.2 dB, which suggests good thermal stability of the filter and sufficient heat dissipation through $LiNbO_3$ on SiC substrates. When the applied power increases to 25 dBm, the performance degradation can become more pronounced and the S21 can decrease by an additional 0.3 dB. However, when the applied power increases to 26 dBm, the filter can show performance degradation and can eventually in some cases fail. In some cases, failure can start near the resonant frequency ($f_{ss}$, 2.28 GHz) of the series resonators.

Figure 16A:
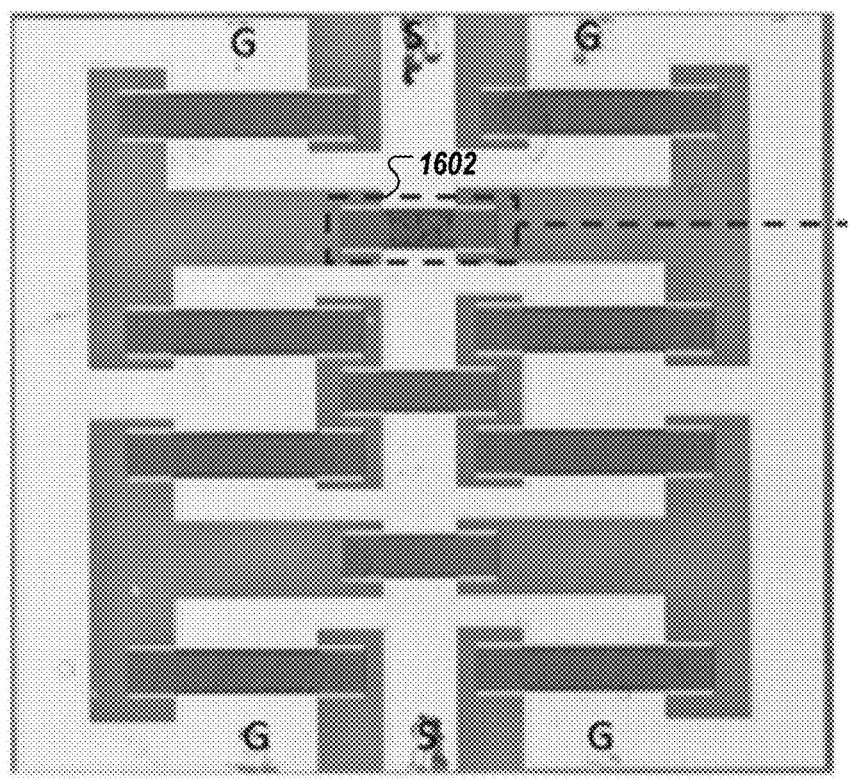
FIG. 16A is an optical image of a fabricated filter after a power handling measurement according to embodiments.
Figure 16B:
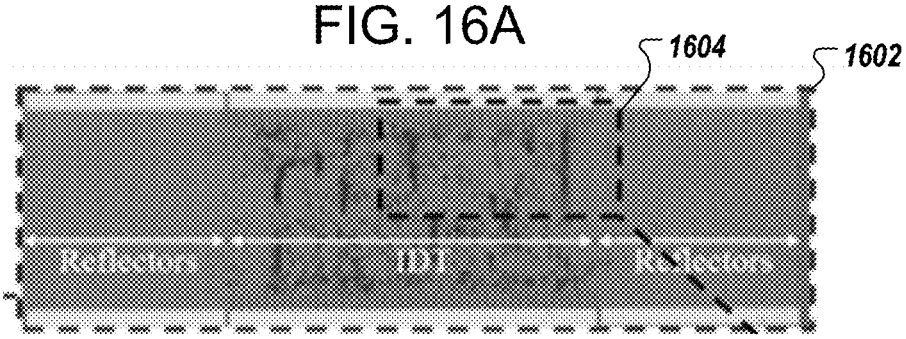
FIG. 16B is a zoomed-in optical image of a region of the fabricated filter after a power handling measurement according to embodiments.
Figure 16C:
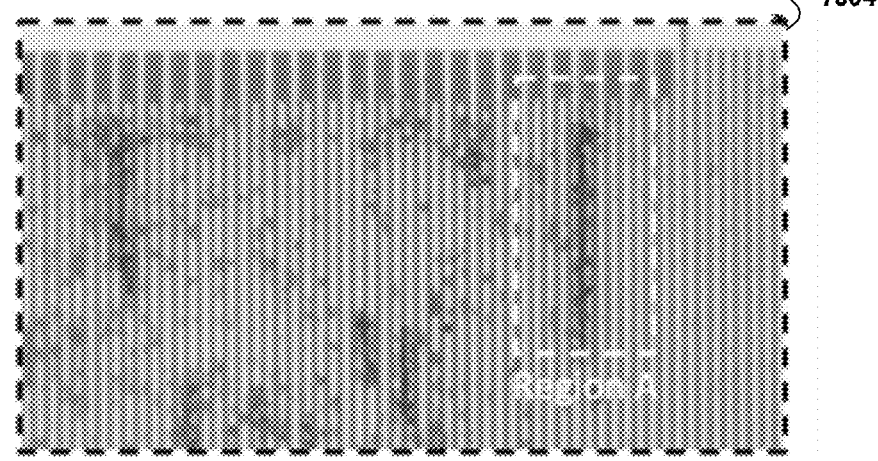
FIG. 16C is a zoomed-in optical image of a region of the fabricated filter after a power handling measurement according to embodiments.

FIG. 16A is an optical image of a fabricated filter after a power handling measurement according to embodiments. FIG. 16B is a zoomed-in optical image of a region 1602 of the fabricated filter after a power handling measurement according to embodiments. FIG. 16B is the region 1602 of FIG. 16A. FIG. 16C is a zoomed-in optical image of a region 1604 of the fabricated filter after a power handling measurement according to embodiments. The region of FIG. 16C is the region 1604 of FIG. 16B. As shown in FIG. 16A, the first series resonator exhibits damages in some areas of the active region such as region 1602. The zoomed-in images shown in FIG. 16B and FIG. 16C can indicate that the interdigital aluminum electrodes have been degraded, including material spreading of the electrode and electrical shorting between two adjacent electrodes.

Figure 17A:
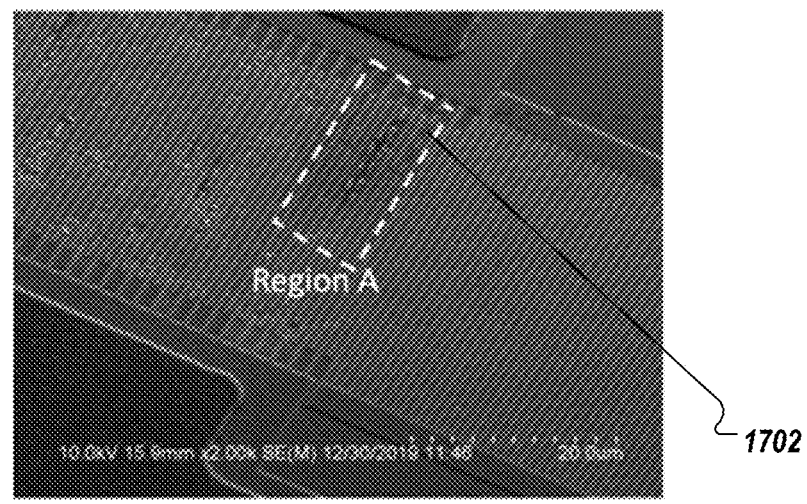
FIG. 17A is a scanning electron microscope (SEM) image of a fabricated filter after a power handling measurement according to embodiments.
Figure 17B:
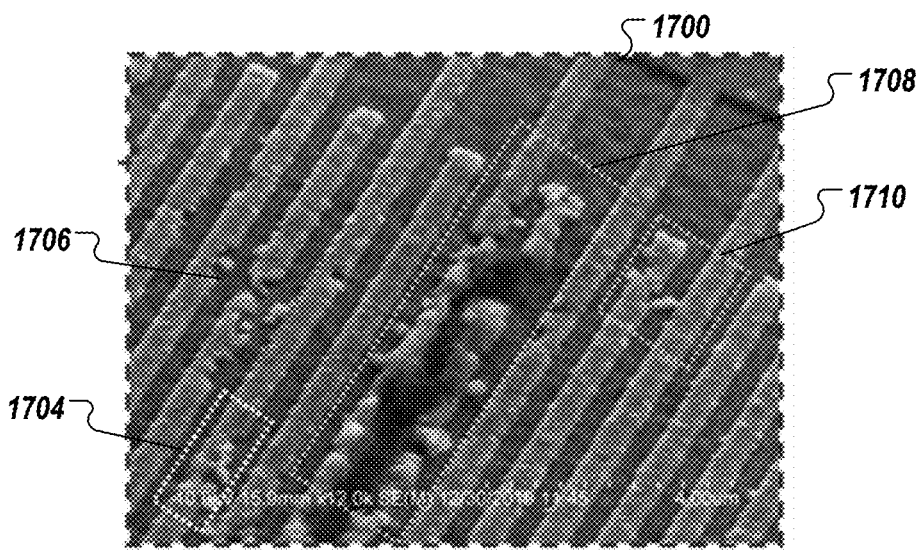
FIG. 17B is a zoomed-in SEM image of a region of the fabricated filter after a power handling measurement according to embodiments.

FIG. 17A is a scanning electron microscope (SEM) image of a fabricated filter after a power handling measurement according to embodiments. FIG. 17B is a zoomed-in SEM image of a region of a fabricated filter after a power handling measurement according to embodiments. The region is the region 1702 of FIG. 17A. Following a power handling measurement, the measured filter can be examined under an optical microscope and an SEM. The optical images and the SEM images are shown in FIG. 16 and FIG. 17, respectively. FIG. 17A shows a corresponding SEM image of the resonator shown in FIG. 16B. In region 1704, FIG. 17B shows the zoomed-in SEM image continuity of an electrode. In region 1706, FIG. 17B further shows aluminum melting or rupture which can break the electrical continuity of an electrode. In regions 1708 and 1710, FIG. 17B shows an electrical short between two adjacent electrodes of opposite polarity.

Transducer electrodes of high-frequency SAW devices can be damaged by direct current (DC) voltage pulses, while metal melting, rupture, or splattering may be observed due to arc discharge (metal to metal discharge). In some embodiments, the temperature can rise and a cyclic stress at the interface between IDTs and substrates can result in Al atoms migrating and thus forming a rupture (e.g., extrusions, voids, and the like) of the electrodes, which can be referred to as "acoustomigration." In regions 1704 and 1706, metal melting and/or rupture does not cause an electrical short. However, regions 1704 and 1706 can present a surface irregularity for the traveling acoustic waves. The filter performance (S21) can be degraded if such discontinuities occur. When melted and/or splattered metal globules or the ruptured metal happen to be in the inter-electrode regions in the active region (e.g. the electrodes in regions 1708 and 1710), the electrical shorting between adjacent electrodes may occur, which can degrade the filter performance and can cause the failure of the filter.

Aluminum electrodes can be damaged for a number of reasons, which can degrade the power handling performance of the filter. First, Al atoms migration (e.g., acoustomigration) can form extrusions and voids in IDTs. Second, the transferred $LiNbO_3$ thin films for device fabrication can be unreduced, as well as the single-crystal $LiNbO_3$ wafer used for wafer bonding, which can result in an electrostatic field at the surface of the transferred $LiNbO_3$ thin films when the temperature changes due to pyroelectric charging effects. Pyroelectric charging effects can stimulate or enhance arc discharge. Additionally, the electrode material, aluminum, can naturally form an oxide surface layer, which could be susceptible to high rates of electron emission, which could stimulate or enhance the arc discharge. Chemically reduced $LiNbO_3$ (also referred to as reduced $LiNbO_3$, or black $LiNbO_3$) refer to $LiNbO_3$ wafers that are chemically reduced using nitrogen and/or hydrogen atmosphere as a specific temperature, and may be done to suppress the pyroelectric effect. This can lead to issues in fabrication and processing that involve temperature fluctuations in some cases. However, using reduced $LiNbO_3$ wafers for bonding can offer advantages that mitigate the electrode damage caused by the arc discharge and improve the power handling performance of the acoustic filters. For example, the reduction process of the $LiNbO_3$ wafer can increase the DC electrical conductivity of the wafer and thus increasing resistance to spurious pyroelectric charging effects during thermal cycling. Strengthened electrodes can suppress acoustomigration in IDTs and can improve the power durability of acoustic filters, such as Al alloy, layered structure, highly-textured Al film, and passivation layer.

SH0 SAW resonators and a group of filters based on the SH0 mode resonators using $LiNbO_3$ thin films on SiC substrates provide for efficient and high-performing SAW devices. The single-crystalline X-cut $LiNbO_3$ thin films on the 4H-SiC substrates can be prepared by the ion-slicing and the wafer bonding process. The fabricated resonator can have a large effective electro-mechanical coupling ($k_t^2$) of 26.9% and a high-quality factor (Bode-Q) of 1228, hence resulting in a high figure of merit (FoM=$k_t^2$·Bode-Q) of 330 at 2.28 GHz. Additionally, these fabricated resonators can have scalable resonances from 1.61 GHz to 3.05 GHz, and impedance ratios between 53.2 dB and 74.7 dB. Filters with the same topology can be designed with center frequencies of 2.16 GHz and 2.29 GHz with sharp roll-off and spurious-free response over a wide frequency range. The filter with a center frequency of 2.29 GHz can have a 3-dB fractional bandwidth (FBW) of 9.9%, an insertion loss (IL) of 1.38 dB, an out-of-band (OoB) rejection of −41.6 dB, a return loss of −19 dB at the center frequency, and a footprint of 0.75 $mm^2$. The fabricated filters can have a temperature coefficient of frequency (TCF) of −48.2 ppm/° C. and a power handling of 25 dBm. Although the power handling may be limited by damage of the aluminum interdigital electrodes due to arc discharge and migration of Al atoms at high power, the acoustic devices on the $LiNbO_3$ on SiC platform can provide potential for radio frequency applications.

FIGS. 18-21 relate to similar acoustic resonators described with respect to FIGS. 1A-1B and acoustic filters describe with respect to FIG. 5C. Devices (e.g., acoustic resonators and/or acoustic filters). The acoustic resonators and acoustic filters described below can be one-port SH0 SAW devices. As described herein, an SH0 mode resonator can include IDTs and reflectors that can be patterned on top of a $LiNbO_3$-on-SiC substrate. The orientation of the device can be chosen at an optimal angle for exciting SH0 modes with high electromechanical coupling, $k_t^2$. Key parameters of a typical SH0 mode resonator are marked in FIGS. 1A-1B. The thickness of the $LiNbO_3$ film and the SiC substrate can be 540 nm and 500 μm, respectively. The main resonance response may not be affected by the ratio of $LiNbO_3$ film thickness (h) to operating wavelength (λ), whereas unwanted wave responses may be affected. Therefore, a λ of 2.4 μm can be selected to mitigate the effects of Rayleigh waves.

Figure 18:
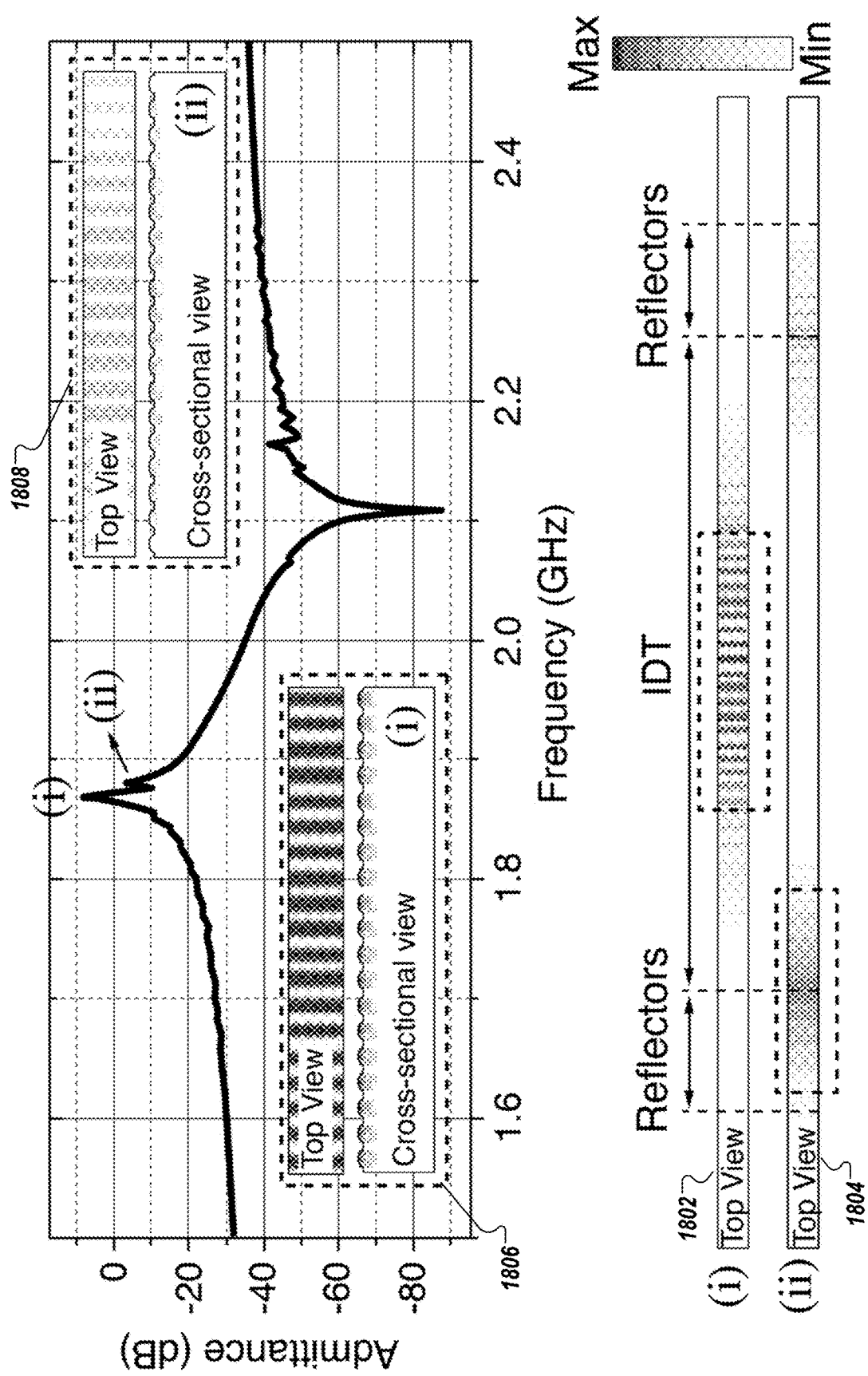
FIG. 18 is a graph illustrating a finite element analysis (FEA) simulated admittance response of a one-port SH0 mode resonator according to embodiments.

FIG. 18 is a graph illustrating an FEA simulated admittance response of a one-port SH0 mode resonator according to embodiments. The SH0 mode resonator can be simulated with a wavelength of 1.86 μm, and thicknesses of the $LiNbO_3$ and SiC of 530 μm and 500 μm, respectively. Further, the SH0 mode resonator can be designed with 20 pairs of IDTs and 15 pairs of reflectors on opposite ends of the IDTs on the $LiNbO_3$-on-SiC substrate. FIG. 18 further illustrates a top view of simulated SH0 displacement mode shapes 1802 and simulated spurious mode shapes 1804. As shown in FIG. 18, the resonator can be simulated with a 3-dimensional FEA (e.g., such as with COMSOL Multiphysics). The simulation indicates a resonance of 1.87 GHz and a $k_t^2$ of 33.7% for the intended SH0 mode. FIG. 18 also illustrates a zoomed-in view of the SH0 displacement mode shape 1806 and a zoomed-in view of the spurious displacement mode shape 1808. The displacement mode shapes can indicate that the energy of the SH0 mode can be confined in the surface area ($LiNbO_3$ film) of the $LiNbO_3$-on-SiC substrate. Moreover, the energy of the spurious mode can be distributed between the IDT and the reflectors.

FIG. 19A is an optical microscope image of a fabricated SH0 resonator according to embodiments. The SH0 mode resonator can be simulated with a wavelength of 1.86 μm, and thicknesses of the $LiNbO_3$ and SiC of 530 μm and 500 μm, respectively. Further, the SH0 mode resonator can be designed with 20 pairs of IDTs and 15 pairs of reflectors on opposite ends of the IDTs on the $LiNbO_3$-on-SiC substrate.

FIG. 19B is a zoomed-in optical microscope image of a region of the fabricated SH0 resonator according to embodiments. The region 1902 of FIG. 19B is illustrated in FIG. 19A. FIG. 19C is a zoomed-in optical microscope image of a region of the fabricated SH0 resonator according to embodiments. The region 1904 of FIG. 19C is illustrated FIG. 19A. The device can be fabricated by electron beam lithography, metal evaporation, and lift-off processes. The device shows good uniformity and the IDT and the reflectors are well defined with high fidelity.

Figure 20A:
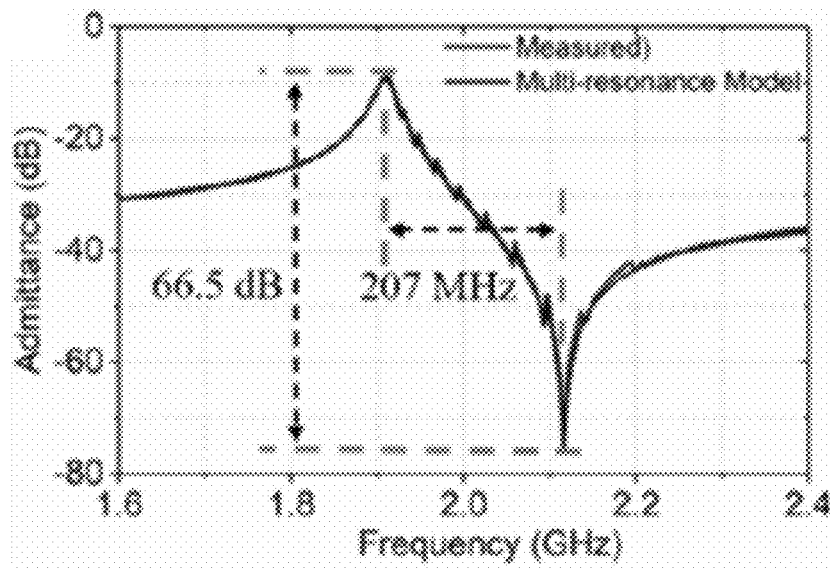
FIG. 20A is a graph illustrating measured and fitted admittance responses of a fabricated SH0 mode resonator according to embodiments.

FIG. 20A is a graph illustrating measured and fitted admittance responses of a fabricated SH0 mode resonator according to embodiments. The fabricated SH0 mode resonator can be the fabricated SH0 mode resonator of FIG. 19A. The fabricated SH0 mode resonator can be the fabricated SH0 mode resonator of FIG. 19A. The fabricated devices can be characterized at room temperature with a network analyzer (such as a Keysight N5249A performance network analyzer (PNA)). As shown in FIG. 20A, the fabricated resonator can have an SH0 mode resonance at 1.909 GHz with an extracted $k_t^2$ of 26.6%. The extracted static capacitance C0 and the quality factor at resonance frequency $Q_s$ (based on a multi-resonance model) are listed in Table 8 below.

TABLE 8

| Symbol | $f_s$ | $k_t^2$ | $C_0$ | $Q_s$ |
|---|---|---|---|---|
| Value | 1909 MHz | 26.6% | 1628 fF | 83 |

The fabricated resonator can have an impedance ratio of 66.5 dB, defined by the impedance at the anti-resonance $f_\alpha$ relative to that at the resonance $f_r$, as well as a fractional bandwidth of 10.3%, defined by the relative separation between $f_r$ and $f_\alpha$. Several transverse modes can also be seen in the intended resonance, which may be mitigated by tilted resonators or dummy electrodes. The extracted $f_r$ may be slightly lower than the simulated result and the extracted $k_t^2$ may be smaller than the simulated one. This phenomenon can be caused by a number of factors. First, the actual orientation of the device may deviate from the simulated setting. Second, the electrodes of the device can have electrical loss. Finally, the device can support excited transverse modes.

Figure 20B:
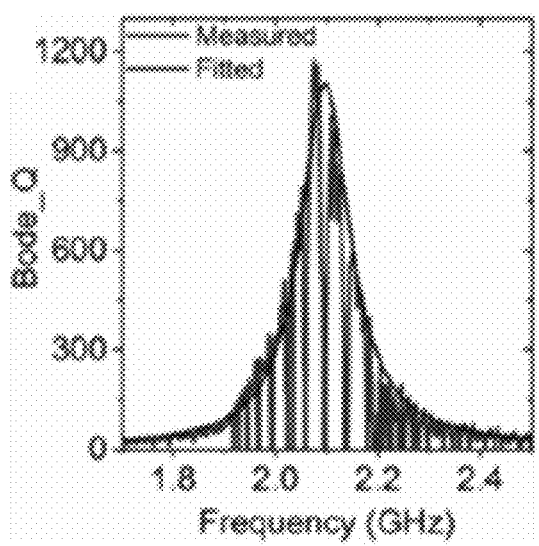
FIG. 20B shows a comparison of the measured and fitted Bode-Q and the agreement is good from 1.7 to 2.5 GHz according to embodiments.

FIG. 20B is a graph illustrating measured and fitted Bode-Q of a fabricated SH0 mode resonator. Based on the comparison of the measured and fitted Bode-Q, it can be seen that agreement is good from 1.7 to 2.5 GHz according to embodiments. However, periodical deteriorations can also be seen in measured Bode-Q near $f_\alpha$, which can be caused by transverse modes. From the results of the fitting, the maximum Bode-Q near $f_\alpha$ can be estimated as 1092, which can result in a high FoM of 290 at 1.90 GHz.

Figure 21A:
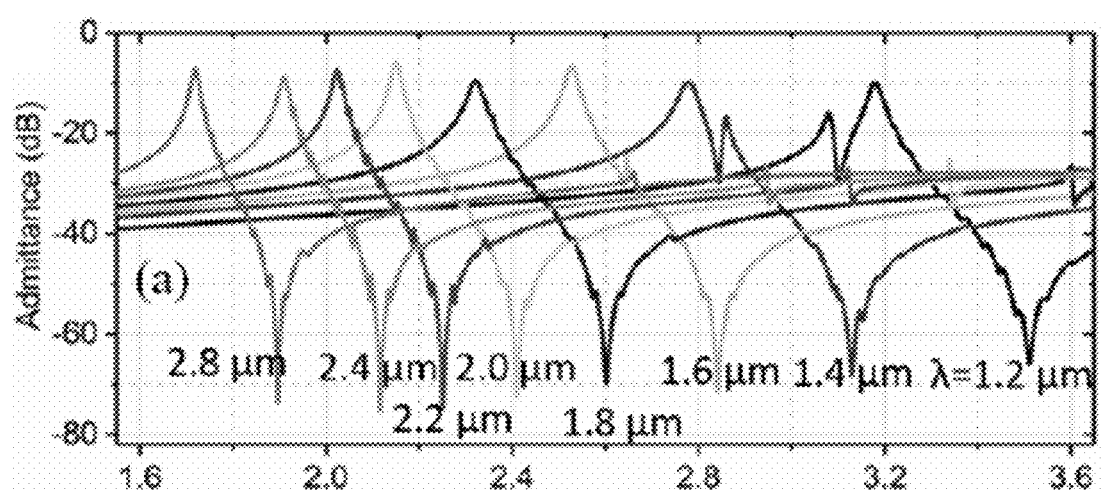
FIG. 21A is a graph illustrating measured admittance responses of fabricated SH0 mode resonators with different wavelengths according to embodiments.

FIG. 21A is a graph illustrating measured admittance responses of fabricated SH0 mode resonators with different wavelengths according to embodiments. The fabricated SH0 mode resonators may have an IDT periodicity (λ) ranging from 1.2 to 2.8 μm. In devices with λ=1.2, 1.4 and 1.6 μm, the Rayleigh wave can be excited, and its resonance can be close to that of the intended SH0 wave. Increasing λ, that is, decreasing h/λ, can mitigate the effect of Rayleigh waves.

Figure 21B:
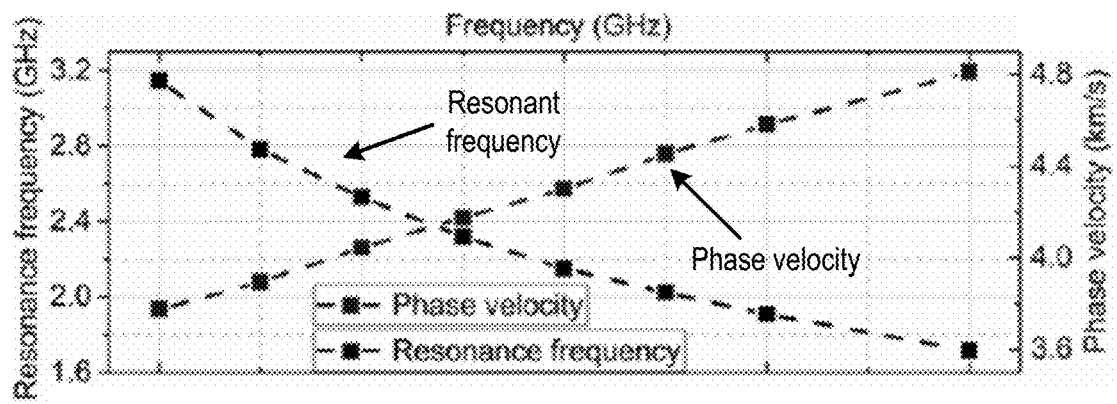
FIG. 21B is a graph illustrating resonance frequencies and phase velocities of fabricated SH0 mode resonators as a function of wavelength according to embodiments.

FIG. 21B is a graph illustrating resonance frequencies and phase velocities of fabricated SH0 mode resonators as a function of wavelength according to embodiments. The resonance frequencies can range from 1.71 to 3.17 GHz, while the phase velocities can range from 3775 to 4810 m/s.

Figure 21C:
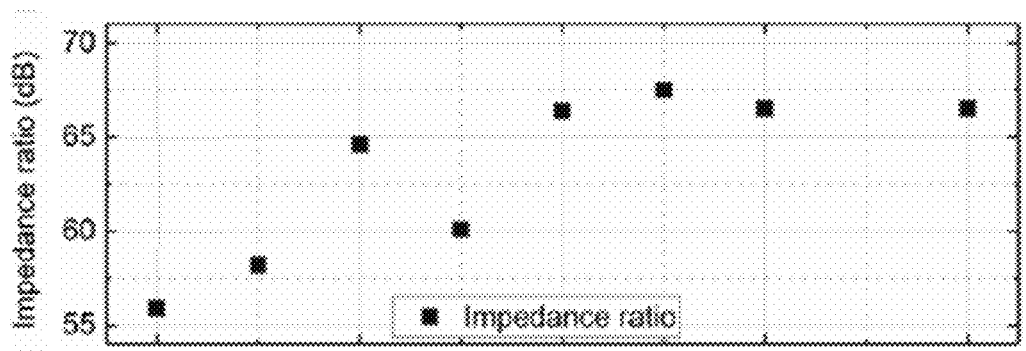
FIG. 21C is a graph illustrating impedance ratios of fabricated SH0 mode resonators as a function of wavelength according to embodiments.

FIG. 21C is a graph illustrating impedance ratios of fabricated SH0 mode resonators as a function of wavelength according to embodiments. FIG. 22C indicates that as λ increases, the impedance ratio can increase. It should be noted that the fabricated resonators can be fabricated by a lift-off process and a smaller λ can correspond to a narrower finger width. With the aluminum evaporation process, electrodes of narrower width may have larger resistivity, and as a result, can cause greater electrical losses.

Figure 21D:
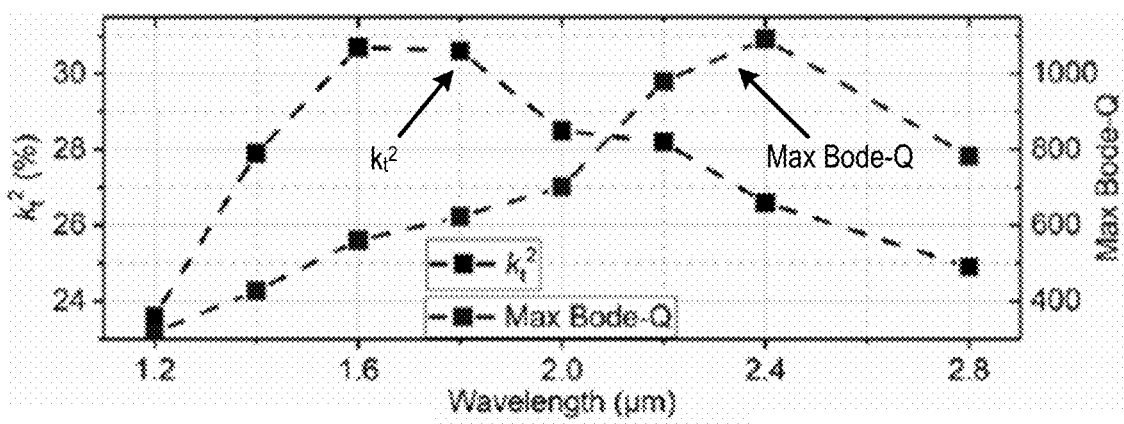
FIG. 21D is a graph illustrating electromechanical coupling ($k_t^2$) coefficients and quality factors (Bode-Q) of fabricated SH0 mode resonators as a function of wavelength according to embodiments.

FIG. 21D is a graph illustrating electromechanical coupling ($k_t^2$) coefficients and quality factors (Bode-Q) of fabricated SH0 mode resonators as a function of wavelength according to embodiments. FIG. 22D illustrates a fitted $k_t^2$ and the maximum the fabricated resonators with different λ. The variation of the $k_t^2$ can be caused by the wave (SH0) dispersion in a thin plate of LiNbO$_3$ and the energy leakage to the SiC substrate when λ is relatively large. The factors that cause the variation of the impedance ratio can also affect the Bode-Q. For instance, surface roughness may cause more severe scattering of the SH0 waves when λ is relatively small. A comparison between various mounted acoustic resonators is shown in Table 9 below.

TABLE 9

| Substrate | $k_t^2$ (%) | $Q_{max}$ | $f_r$ (GHz) | FoM | ML |
|---|---|---|---|---|---|
| LiTaO$_3$ | 8.0 | 1050 | 1.9 | 84 | N |
| LiNbO$_3$ | 7.0 | 1070* | 1.0 | 75 | N |
| LiTaO$_3$ on Si | 7.5 | 1700 | 1.6 | 128 | N |
| LiTaO$_3$ on ML | 9.8 | 4200 | 1.9 | 411 | Y |
| LiNbO$_3$ on ML | 24.7 | 664 | 3.5 | 164 | Y |
| LiNbO$_3$ on SiC | 26.6 | 1092 | 1.9 | 290 | N |

It should be noted that the asterisk in Table 9 indicates Q near the anti-resonance. The fabricated device demonstrates a high $k_t^2$ and Bode-Q. The Bode-Q can be further increased by reducing electrical loss of the electrodes. Single-crystal piezoelectric films can be bonded to ML substrates which can result in higher Q.

Single-crystalline X-cut LiNbO$_3$ thin films on the 4H-SiC substrate can be prepared by the ion-slicing process. The design and fabrication of high-performance SH0 mode resonators on the heterogeneous substrate can also be prepared by the ion-slicing process. Overall, the fabricated resonator has demonstrated a large $k_t^2$ and a high Bode-Q of 1092, which can result in a high FoM of 290 at 1.90 GHz. Resonators with different λ can have resonance frequencies ranging from 1.71 GHz to 3.17 GHz, and an impedance ratio between 55.9 dB and 67.5 dB.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An acoustic resonator comprising:
 a piezoelectric thin film disposed on a carrier substrate, wherein the piezoelectric thin film is adapted to confine a fundamental shear horizontal (SH0) surface acoustic wave (SAW) within the piezoelectric thin film;
an input bus line coupled to an input source;
a ground bus line coupled to a ground potential;
a first grating reflector disposed at a first end of the piezoelectric thin film and coupled between the input bus line and the ground bus line;
a second grating reflector disposed at a second end of the piezoelectric thin film, the second end being opposite the first end, the second grating reflector being coupled between the input bus line and the ground bus line; and
a plurality of interdigital transducers (IDTs) disposed between the first grating reflector and the second grating reflector, wherein each IDT comprises an input electrode and a ground electrode, the input electrode being coupled to the input bus line and the ground electrode being coupled to the ground bus line.

2. The acoustic resonator of claim 1, wherein the piezoelectric thin film is one of an X-cut lithium niobate (LiNbO$_3$) thin film or lithium tantalate (LiTaO$_3$) thin film.

3. The acoustic resonator of claim 1, wherein the carrier substrate is one of diamond, sapphire, alpha-quartz, or silicon carbide (SiC), wherein the SiC is one of four-hexagonal (4H)-SiC or six-hexagonal (6H)-SiC.

4. The acoustic resonator of claim 1, wherein the piezoelectric thin film is solid-mounted piezoelectric thin film.

5. The acoustic resonator of claim 1, wherein the first grating reflector and the second grating reflector each comprise a plurality of parallel metal strips, wherein a periodicity of the metal strips is half of a periodicity of the IDTs.

6. The acoustic resonator of claim 1, wherein a distal end of the input electrode is separated from the ground bus line by a first distance, and a distal end of the ground electrode is separated from the input bus line by one of the first distance or a second distance.

7. The acoustic resonator of claim 1, wherein a distal end of the input electrode is separated from a distal end of the ground electrode by a second distance, the second distance being an aperture width of the acoustic resonator.

8. The acoustic resonator of claim 7, wherein a ratio of the aperture width to a width of the input electrode and the ground electrode is between 20 and 100.

9. The acoustic resonator of claim 1, wherein the first grating reflector is separated from a first IDT of the plurality of IDTs by a first distance, and the second grating reflector is separated from a second IDT of the plurality of IDTs by the first distance.

10. The acoustic resonator of claim 1, wherein a ratio of a thickness of the piezoelectric thin film to a wavelength of the SH0-SAW is less than 0.35.

11. An acoustic filter comprising:
a first shunt resonator coupled to a ground potential
a second shunt resonator coupled to the ground potential; and
a series resonator coupled between the first shunt resonator and the second shunt resonator and to an input source, wherein the first shunt resonator, the second shunt resonator, and the series resonator each comprises:
a piezoelectric thin film disposed on a carrier substrate, wherein the piezoelectric thin film is adapted to confine a fundamental shear horizontal (SH0) surface acoustic wave (SAW) within the piezoelectric thin film;
an input bus line coupled to the input source;
a ground bus line coupled to the ground potential;
a first grating reflector disposed at a first end of the piezoelectric thin film and coupled between the input bus line and the ground bus line;
a second grating reflector disposed at a second end of the piezoelectric thin film, the second end being opposite the first end, the second grating reflector being coupled between the input bus line and the ground bus line; and
a plurality of interdigital transducers (IDTs) disposed between the first grating reflector and the second grating reflector, wherein each IDT comprises an input electrode and a ground electrode.

12. The acoustic filter of claim 11, wherein the input electrode is coupled to an input pad and the ground electrode is coupled to a ground pad, and wherein the input pad is coupled to the input source and the ground pad is coupled to the ground potential.

13. The acoustic filter of claim 11, wherein the piezoelectric thin film is one of an X-cut lithium niobate (LiNbO$_3$) thin film or lithium tantalate (LiTaO$_3$) thin film.

14. The acoustic filter of claim 11, wherein the carrier substrate is one of diamond, sapphire, alpha-quartz, or silicon carbide (SiC), wherein the SiC is four-hexagonal (4H)-SiC or six-hexagonal (6H)-SiC.

15. The acoustic filter of claim 11, wherein the series resonator operates at a first frequency, the first shunt resonator and the second shunt resonator operate at a second frequency that is offset from the first frequency, and wherein a bandwidth of the acoustic filter is approximately the offset.

16. The acoustic filter of claim 15, wherein the offset is approximately a spectral separation between a resonant frequency of the first shunt resonator and an anti-resonant frequency of the series resonator.

17. The acoustic filter of claim 15, wherein the offset is determined by varying a periodicity of the plurality of IDTs.

18. An apparatus comprising:
a piezoelectric thin film disposed on a carrier substrate, wherein the piezoelectric thin film is adapted to propagate a fundamental shear horizontal (SH0) surface acoustic wave (SAW);
a plurality of pairs of interdigital transducer (IDT) electrodes disposed on top of the piezoelectric thin film, wherein each pair of the plurality of pairs of IDT electrodes comprises a signal electrode and a ground electrode, wherein signal electrodes between adjacent pairs of the plurality of pairs of IDTs are separated by a first period;
a first grating reflector disposed at a first end of the piezoelectric thin film and separated from a first end of the plurality of pairs of IDT electrodes, wherein the first grating reflector comprises a first set of electrically-shorted metal strips separated according to a second period; and
a second grating reflector disposed at a second end of the piezoelectric thin film and separated from a second end of the plurality of pairs of IDT electrodes.

19. The apparatus of claim 18, wherein the second period is approximately half of the first period.

20. The apparatus of claim 18, wherein the signal electrode extends distally away from an input bus line and the ground electrode extends distally away from a ground bus line, and wherein an aperture of the apparatus comprises a distance between a distal end of the signal electrode and a distal end of the ground electrode.

21. The apparatus of claim 18, wherein the second grating reflector comprises a second set of electrically-shorted metal strips separated according to a third period.

22. The apparatus of claim 21, wherein a separation between the first grating reflector and the first end of the plurality of pairs of IDT electrodes comprises a first distance, and wherein a separation between the second end of the plurality of pairs of IDTs and the second grating reflector comprises a second distance.

23. The apparatus of claim 18, wherein the piezoelectric thin film is one of an X-cut lithium niobate ($LiNbO_3$) thin film or lithium tantalate ($LiTaO_3$) thin film.

24. The apparatus of claim 18, wherein the carrier substrate is one of diamond, sapphire, alpha-quartz, or silicon carbide (SiC), wherein the SiC is four-hexagonal (4H)-SiC or six-hexagonal (6H)-SiC.

* * * * *